US006560153B2

(12) United States Patent
Mizugaki

(10) Patent No.: US 6,560,153 B2
(45) Date of Patent: May 6, 2003

(54) SEMICONDUCTOR DEVICE, METHOD FOR REFRESHING THE SAME, SYSTEM MEMORY, AND ELECTRONICS APPARATUS

(75) Inventor: Koichi Mizugaki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/949,672

(22) Filed: Sep. 12, 2001

(65) Prior Publication Data
US 2002/0051398 A1 May 2, 2002

(30) Foreign Application Priority Data
Sep. 12, 2000 (JP) ........................................ 2000-276034

(51) Int. Cl.$^7$ ............................................... G11C 7/00
(52) U.S. Cl. .................... 365/222; 365/230.03; 365/233

(58) Field of Search ........................... 365/222, 230.03, 365/233, 230.06, 236; 711/106

(56) References Cited
U.S. PATENT DOCUMENTS 6,285,616 B1 * 9/2001 Ikabata .................. 365/189.04
2002/0049884 A1 * 4/2002 Mizugaki .................... 711/106

* cited by examiner

Primary Examiner—David Lam
(74) Attorney, Agent, or Firm—Oliff & Berridge, PLC.

(57) ABSTRACT

The present invention provides a semiconductor device that includes a memory cell array that can be divided into four blocks. During a period in which data is read or written in one of the blocks, refreshing is conducted in all of the other remaining blocks. Also, in a standby state or in an operation state, refreshing for each of the plurality of blocks is performed with time differences provided therebetween, such that the peak current is lowered.

18 Claims, 17 Drawing Sheets

SEMICONDUCTOR DEVICE, METHOD FOR REFRESHING THE SAME, SYSTEM MEMORY, AND ELECTRONICS APPARATUS

BACKGROUND OF THE INVENTION

1. Field of Invention

The present invention relates to semiconductor devices that retain data through refreshing, methods of the refreshing, memory systems and electronic apparatuses.

2. Description of Related Art

Currently, the use of VSRAMs (Virtually Static RAMs) as semiconductor memories is well known. Memory cells of a VSRAM are similar to those of a DRAM, with the exception that in a VSRAM, column addresses and row addresses do not need multiplexing. Additionally, a user can use a VSRAM without having to consider refreshing (i.e., refreshing transparency).

SUMMARY OF THE INVENTION

It is an object of the present invention to provide a semiconductor device that retains data through refreshing, a method of the refreshing, a memory system and an electronic apparatus.

A method for refreshing a semiconductor device in accordance with the present invention pertains to a method for refreshing a semiconductor device having a memory cell array that is divided in a plurality of blocks. The method can include a first step of placing the semiconductor device in an externally accessible first state, a second step of conducting refreshing during the first state for a block among the plurality of blocks other than a block to be externally accessed, a third step of placing the semiconductor device in an externally inaccessible second state, and a fourth step of conducting refreshing during the second state for at least one of the blocks among the plurality of blocks with a time difference provided with respect to refreshing for the remaining blocks.

The semiconductor device in accordance with the present invention can require refreshing in order to retain data. For this reason, power is consumed by refreshing even in the externally accessible second state. In the second state, power is consumed mainly for refreshing, such that the peak current at the refreshing becomes the maximum current. In accordance with the present invention, refreshing for the entire blocks is not simultaneously performed during the second state, but performed with time differences. As a result, the peak current at the refreshing can be lowered.

Accordingly, in accordance with the present invention, a small size battery such as a button battery can be used as a back-up power supply source. In other words, in many situations there exists a demand that data be backed up only with a button battery. However, since the internal resistance of the button battery is large (several kΩ), the voltage fall may become large when the peak current is large. As a result, there are occasions that data cannot be retained. In accordance with the present invention, the peak current at refreshing can be lowered, such that a small size battery such as a button battery can therefore be used as a back-up power supply source.

Also, in accordance with the present invention, in the first state, refreshing is conducted for blocks that require to be refreshed are refreshed while a block to be externally accessed is externally accessed. As a result, the semiconductor device can be effectively operated.

It is noted that the first state can be, for example, an operation state. The second state can be, for example, a power-down state, or a standby state and a power-down state.

The number of blocks to be externally accessed may be one or greater. The number of blocks to be externally accessed can be optionally decided at the time of designing a semiconductor device.

Conducting refreshing for a block can mean, for example, to conduct refreshing for memory cells in a certain row in the block. The row may be one row or plural rows. They can be optionally decided when a semiconductor device is designed.

External access can mean, for example, to read data from or write data in a memory cell.

The method for refreshing a semiconductor device in accordance with the present invention can further include that in the fourth step, refreshing of each of the plurality of blocks is conducted with a time difference provided therebetween.

This can mean that when the plurality of blocks includes, for example, four blocks, refreshing is initially conducted for a first block, refreshing is secondly conducted for a second block, refreshing is thirdly conducted for a third block, and refreshing is finally conducted for a fourth block.

When the number of blocks to be simultaneously refreshed increases, the peak current becomes large. In accordance with the present invention, since refreshing of each of the plurality of blocks is conducted with a time difference being provided therebetween, the peak current can be lowered.

The method for refreshing a semiconductor device in accordance with the present invention can further include that the second step and the fourth step include a fifth step of generating a first refresh address signal that is a signal for selecting a first memory cell group to be refreshed that is located in each of the plurality of blocks, and a sixth step of activating a plurality of refresh request signals that are signals for requesting refreshing for each of the plurality of blocks.

It is noted that the first memory cell group to be refreshed can mean, for example, a plurality of memory cells in a row to be refreshed. The number of memory cells in the first memory cell group to be refreshed may be one or a plural.

The method for refreshing a semiconductor device in accordance with the present invention can further include that in the sixth step in the second state, the plurality of refresh request signals are activated with time differences being mutually provided therebetween. In accordance with the present invention, since time differences can be provided between refreshing operations for the plurality of blocks, the peak current can be lowered.

The method for refreshing a semiconductor device in accordance with the present invention can further include that in the sixth step in the second state, the plurality of refresh request signals for refreshing the first memory cell group in each of the blocks are activated in a specified order, and, the method further including, after the sixth step in the second state, a seventh step of generating a second refresh address signal for selecting a second memory cell group to be refreshed that is located in each of the plurality of blocks based on a signal among the plurality of refresh request signals that lastly becomes non-active.

In accordance with the present invention, refreshing for each of the blocks can be securely conducted during the second state. The reasons therefore are described below in greater detail with respect to an embodiment of the present invention.

The method for refreshing a semiconductor device in accordance with the present invention can further include that the method further includes, after the sixth step in the first state, an eighth step of generating a second refresh address signal for selecting a second memory cell group to be refreshed that is located in each of the plurality of blocks based on all of the plurality of refresh request signals that are non-active.

In accordance with the present invention, refreshing for each of the blocks can be securely conducted during the first state. The reasons therefor are described below in greater detail with respect to an embodiment of the present invention.

The method for refreshing a semiconductor device in accordance with the present invention can be made as follows. The semiconductor device can include a VSRAM (Virtually Static RAM).

In a method for refreshing a semiconductor device, the number of memory cells to be refreshed at once is fewer in an externally inaccessible second state of the semiconductor device than in an externally accessible first state of the semiconductor device. In accordance with the present invention, the peak current can be lowered in the second state.

The method for refreshing a semiconductor device in accordance with the present invention can be made as follows. The semiconductor device can be equipped with a memory cell array including the memory cells, and the memory cell array can be divided into a plurality of blocks.

The method for refreshing a semiconductor device in accordance with the present invention can be made as follows. In the second state, a refreshing operation for each of the memory cells in each of the plurality of blocks is conducted with a time difference provided therebetween.

A semiconductor device in accordance with the present invention pertains to a semiconductor device that retains data through refreshing. The device can include a memory cell array that is divided into a plurality of blocks, and a refresh control circuit that conducts refreshing, during an externally accessible first state of the semiconductor device, for a block among the plurality of blocks other than a block to be externally accessed, and conducts refreshing, during an externally inaccessible second state, for each of the blocks among the plurality of blocks with a time difference provided with respect to one another.

The semiconductor device in accordance with the present invention can be made as follows. The refresh control circuit can include a refresh address signal generation circuit that generates a first refresh address signal that is a signal for selecting a first memory cell group to be refreshed that is located in each of the plurality of blocks, a refresh timing signal control that controls a plurality of refresh timing signals respectively corresponding to the plurality of blocks, and a plurality of refresh request signal generation circuits provided for the corresponding respective plurality of blocks, wherein each of the refresh request signal generation circuits generates a refresh request signal for each of the plurality of blocks based on a corresponding one of the plurality of refresh timing signals.

The refresh address signal generation circuit can include, for example, a RF (refresh) counter.

The semiconductor device in accordance with the present invention can be made as follows. The refresh timing signal control activates the plurality of refresh timing signals with time differences provides therebetween in the second state.

In accordance with the present invention, the plurality of refresh timing signals are activated with time differences provided therebetween. As a result, time differences can be provided between refreshing operations for the plurality of blocks, such that the peak current can be lowered.

The semiconductor device in accordance with the present invention can be made as follows. The refresh timing signal control includes a detection circuit that detects a start of the second state, wherein the refresh timing signal control activates, in the second state, the plurality of refresh timing signals in a specified order based on a detection signal from the detection circuit, and the refresh address signal generation circuit generates, in the second state, a second refresh address signal for selecting a second memory cell group to be refreshed that is located in each of the plurality of blocks based on a signal among the plurality of refresh request signals that lastly becomes non-active.

The semiconductor device in accordance with the present invention can be made as follows. The refresh address signal generation circuit generates, in the first state, a second refresh address signal for selecting a second memory cell group to be refreshed that is located in each of the plurality of blocks based on all of the plurality of refresh request signals that are non-active.

The semiconductor device in accordance with the present invention can be made as follows. The semiconductor device includes a VSRAM (Virtually Static RAM).

Additionally, the above-described semiconductor device can be included in an electronic device in accordance with the present invention.

BRIEF DESCRIPTION OF THE DRAWINGS

The invention will be described in connection with the following figures, wherein like numerals represent like elements, and wherein.

DETAILED DESCRIPTION OF PREFERRED EMBODIMENTS

Figure 1:
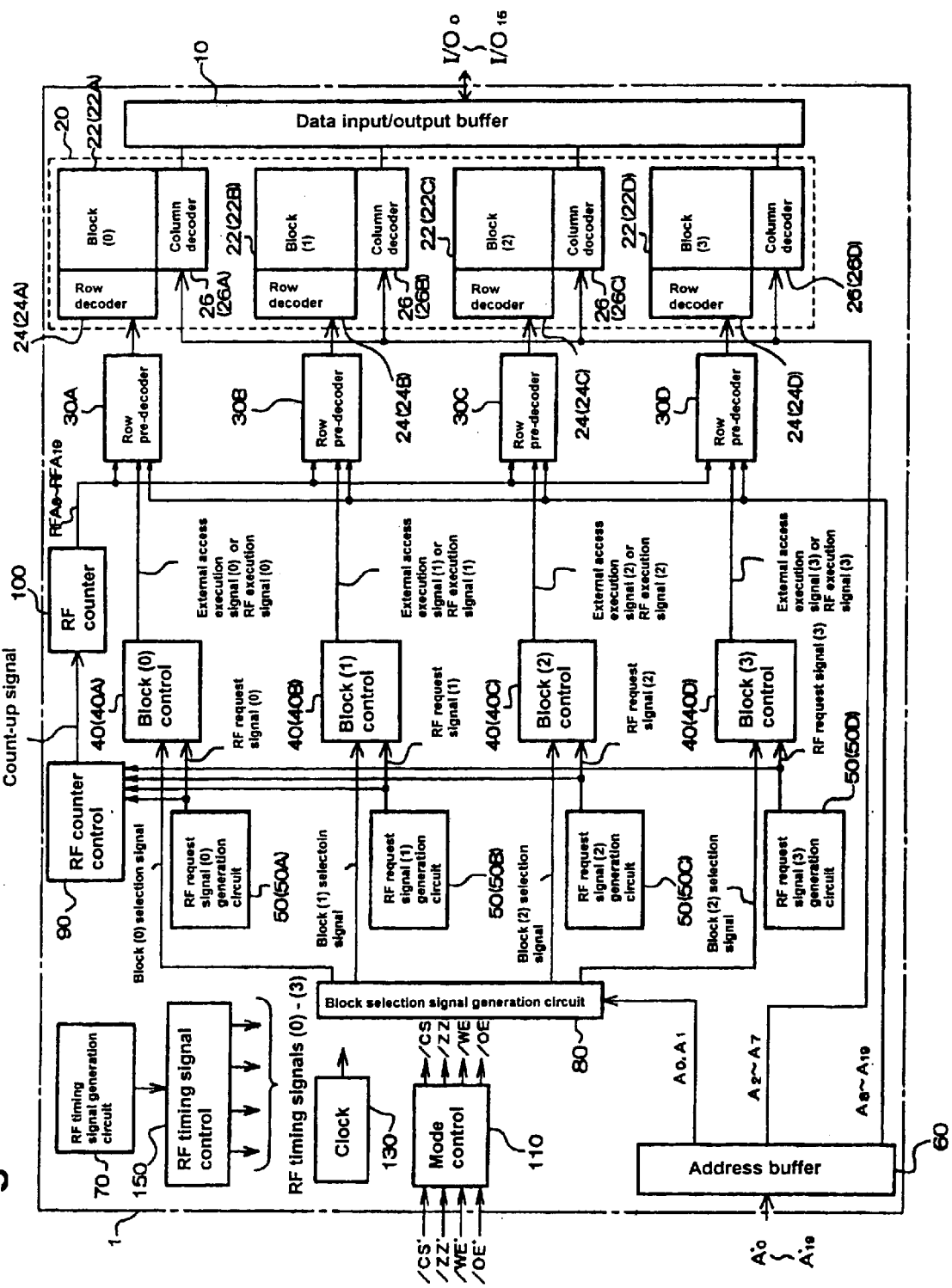
FIG. 1 shows an exemplary circuit block diagram of a semiconductor device in accordance with one embodiment of the present invention.

FIG. 1 shows an exemplary block diagram of a semiconductor device 1 in accordance with the embodiment of the present invention. Each of the blocks are described in greater detail below.

A data input/output buffer 10 receives an input of or outputs data in 16 bits ($I/O_0$~$I/O_{15}$).

A memory cell array 20 includes a plurality of memory cells disposed in an array. The memory cell can include an access transistor that is an n-type MOS transistor and a capacitor for retaining data. The memory cell array 20 can be divided into four blocks 20. In other words, a block (0) 22A, a block (1) 22B, a block (2) 22C and a block (3) 22D. For example, when the memory cell array 20 retains 16 Mbit, each of the blocks 22 retains for example 4 Mbit. It is noted that, in accordance with the present invention, the memory cell array 20 may be divided into two or more blocks without departing from the spirit and scope of the present invention. The number of the blocks may be an odd number or an even number.

Each of the blocks 22 can further be equipped with a plurality of word lines, a plurality of bit line pairs crossing these word lines, and the above-described memory cells provided at intersections of the words lines and the bit line pairs. The word lines correspond respectively to the memory cells in each of the rows in the block. In other words, when a specified word line is selected, those of the memory cells in a row corresponding to the word line are selected.

Each of the blocks 22 can further be equipped with a row decoder 24 and a column decoder 26. The word lines are selected by the row decoder 24. The bit line pairs are selected by the column decoder 26.

Address signals $A'_0$~$A'_{19}$ for external accesses (for example, for reading or writing) are externally input in an address buffer 60. The address signals $A'_0$ and $A'_1$ are allocated to block address signals $A_0$ and $A_1$. In other words, the address signal $A'_0$ at the least significant level is allocated to the block address signal $A_0$. The address signal $A'_1$ that is at one level higher than the least significant level is allocated to the block address signal $A_1$. Those of the blocks 22 in which memory cells to be externally accessed are disposed are selected based on the block address signals $A'_0$ and $A'_1$.

The address signals $A'_2$~$A'_7$ are allocated to column address signals $A_2$~$A_7$. The column address signals $A_2$~$A_7$ are input in column decoders 26A~26D. Those of the column addresses in each of the blocks 22 are selected based on the column address signals $A_2$~$A_7$.

The address signals $A'_8$~$A'_{19}$ are allocated to row address signals $A_8$~$A_{19}$. The row address signals $A_8$~$A_{19}$ are input in row pre-decoders 30A~30D and are described below in greater detail. Those of the row addresses in each of the blocks 22 are selected based on the row address signals $A_8$~$A_{19}$. It is noted that the address signals $A'_0$~$A'_{19}$ are allocated to the block address signals, the column address signals and the row address signals in this order. However, it is to be understood that the address signals can be allocated in a different order.

The block address signals $A_0$ and $A_1$ are input in a block selection signal generation circuit 80. Block (0) selection signal~block (3) selection signal are output from the block selection signal generation circuit 80.

When the block address signals ($A_0$ and $A_1$) are at (L level and L level), respectively, the block selection signal generation circuit 80 outputs the block (0) selection signal at H level (active) and the block (1)~(3) selection signals at L level. Based on the block (0) selection signal at H level, the block (0) 22A is selected.

When the block address signals ($A_0$ and $A_1$) are at (H level and L level), respectively, the block selection signal generation circuit 80 outputs the block (1) selection signal at H level (active) and the block (0), (2) and (3) selection signals at L level. Based on the block (1) selection signal at H level, the block (1) 22B is selected.

When the block address signals ($A_0$ and $A_1$) are at (L level and H level), respectively, the block selection signal generation circuit 80 outputs the block (2) selection signal at H level (active) and the block (0), (1) and (3) selection signals at L level. Based on the block (2) selection signal at H level, the block (2) 22C is selected.

When the block address signals ($A_0$ and $A_1$) are at (H level and H level), respectively, the block selection signal generation circuit 80 outputs the block (3) selection signal at H level (active) and the block (0), (1) and (2) selection signals at L level. Based on the block (3) selection signal at H level, the block (3) 22D is selected.

It is noted that the block selection signal generation circuit 80 is described below in greater detail.

A RF (refresh) timing signal generation circuit 70 includes a ring oscillation circuit and generates a RF (refresh) timing signal. The RF timing signal generation circuit 70 periodically makes the RF timing signal at H level (active).

The RF timing signal from the RF timing signal generation circuit 70 is input in a RF (refresh) timing signal control 150. Then, the RF timing signal control 150 makes the RF timing signal into RF timing signals (0)~(3) corresponding to the respective blocks 22 and outputs the same. Based on rising of the RF timing signals (0)~(3), RF (refreshing) request signals (0)~(3) to be described next are made to H level (active). It is noted that the RF timing signal control 150 is described in greater detail below.

A RF (refresh) request signal generation circuit 50 can be provided for each of the blocks 22. Accordingly, in the present embodiment, four RF request signal generation circuits 50. In other words, a RF request signal (0) generation circuit 50A, a RF request signal (1) generation circuit 50B, a RF request signal (2) generation circuit 50C, and a RF request signal (3) generation circuits 50D are provided.

The corresponding RF timing signals (0)~(3) from the RF timing signal control 150 are input in the RF request signal (0) generation circuit 50A, the RF request signal (1) generation circuit 50B, the RF request signal (2) generation circuit 50C, and the RF request signal (3) generation circuits 50D, respectively.

The RF request signal (0) generation circuit 50A, the RF request signal (1) generation circuit 50B, the RF request signal (2) generation circuit 50C, and the RF request signal (3) generation circuits 50D output corresponding RF request signals (0)~(3), respectively. It is noted that the RF request signal generation circuits 50 are described below in greater detail.

A block control 40 can be provided for each of the blocks 22. Accordingly, the present embodiment is equipped with four block controls 40. In other words, a block (0) control 40A, a block (1) control 40B, a block (2) control 40C and a block (3) control 40D. The block controls 40A~40D receive inputs of the corresponding RF request signal (0)~the RF request signal (3) and the block (0) selection signal~the block (3) selection signal, respectively.

The block controls 40A~40D control external access executions or refresh executions at their corresponding blocks 22A~22D. This is described with reference to the block (0) control 40A as an example. First, the description is made with respect to the case in which the block (0) 22A is externally accessed. In this case, a block (0) selection signal at H level (active) is input in the block (0) control 40A. As a result, the block (0) control 40A outputs an external access execution signal at H level (active). Relevant memory cells in the block (0) 22A corresponding to the block (0) control 40A are externally accessed based on the external access execution signal (0).

Next, the description is made with respect to the case in which refreshing is conducted for the block (0) 22A. In this case, a block (0) selection signal at L level and a RF request signal (0) at H level (active) are input in the block (0) control 40A. As a result, the block (0) control 40A outputs a RF execution signal (0) at H level (active). Memory cells in a relevant row in the block (0) 22A are refreshed based on the RF request signal (0). It is noted that the block controls 40 are described below in greater detail.

A RF counter 100 has a structure similar to that of an ordinary counter. The RF counter 100 outputs refresh address signals $RFA_8$~$RFA_{19}$, and the signals are input in the row pre-decoders 30A~30D. Based on the refresh address signals $RFA_8$~$RFA_{19}$, memory cells in a row to be refreshed in each of the blocks 22 are selected.

The row pre-decoders 30A~30D supply signals for driving word lines to the corresponding row decoders 24A~24D, and perform the following operations. The refresh address signals $RFA_8$~$RFA_{19}$ from the RF counter 100 and the row address signals $A_8$~$A_{19}$ are input in the row pre-decoders 30A~30D. For example, when the block (0) 22A is one of the blocks 22 to be externally accessed, the external access execution signal (0) at H level (active) is input in the row pre-decoder 30A, and the RF execution signals (1)~(3) at H level (active) are input in the row pre-decoders 30B~30D, respectively. As a result, the row pre-decoder 30A supplies to the row decoder 24A a signal for driving a word line that selects memory cells to be externally accessed. On the other hand, the row pre-decoders 30B~30D supply to the row decoders 24B~24D, respectively, signals for driving word lines that select memory cells to be refreshed. It is noted that the row pre-decoders 30A~30D are described in greater detail below.

RF request signal (0)~RF request signal (3) from the RF request signal generation circuit 50 are input in an RF counter control 90. The RF counter control 90 outputs a count-up signal. The count-up signal is input in the RF counter 100. It is noted that the RF counter control 90 is described in greater detail below.

A mode control 110 receives a chip select signal /CS', a snooze signal /ZZ', a write enable signal /WE' and an output enable signal /OE', which are externally inputted. Then, the mode control 110 outputs a chip select signal /CS, a snooze signal /ZZ, a write enable signal /WE, and an output enable signal /OE.

When the chip select signal /CS is at L level, the semiconductor device 1 is placed in the operation state. On the other hand, when the chip select signal /CS is at H level, it is placed in the standby state. Refreshing is performed even in the standby state. In the standby state, and when the snooze signal /ZZ is at L level, the power down state takes place. In this state, an IC (for example, a CPU) that controls the semiconductor device 1 is non-active. As a result, the current consumption of the semiconductor device 1 becomes the minimum level. In contrast, in the standby state, and when the snooze signal /ZZ is at H level, the standby state takes place. In this state, an IC (for example, a CPU) that controls the semiconductor device 1 is active.

The semiconductor device 1 is equipped with a clock 130. A clock signal that is output from the clock 130 becomes a reference signal for operations such as external access, refreshing and the like for the semiconductor device 1.

External accesses to the semiconductor device 1 (for example, reading and writing data) are performed in the same manner as performed in an ordinary SRAM (static random access memory), and the description thereof is omitted. Refresh operations of the semiconductor device 1 are described, individually in the operation state, the standby state and the power-down state.

Figure 2:
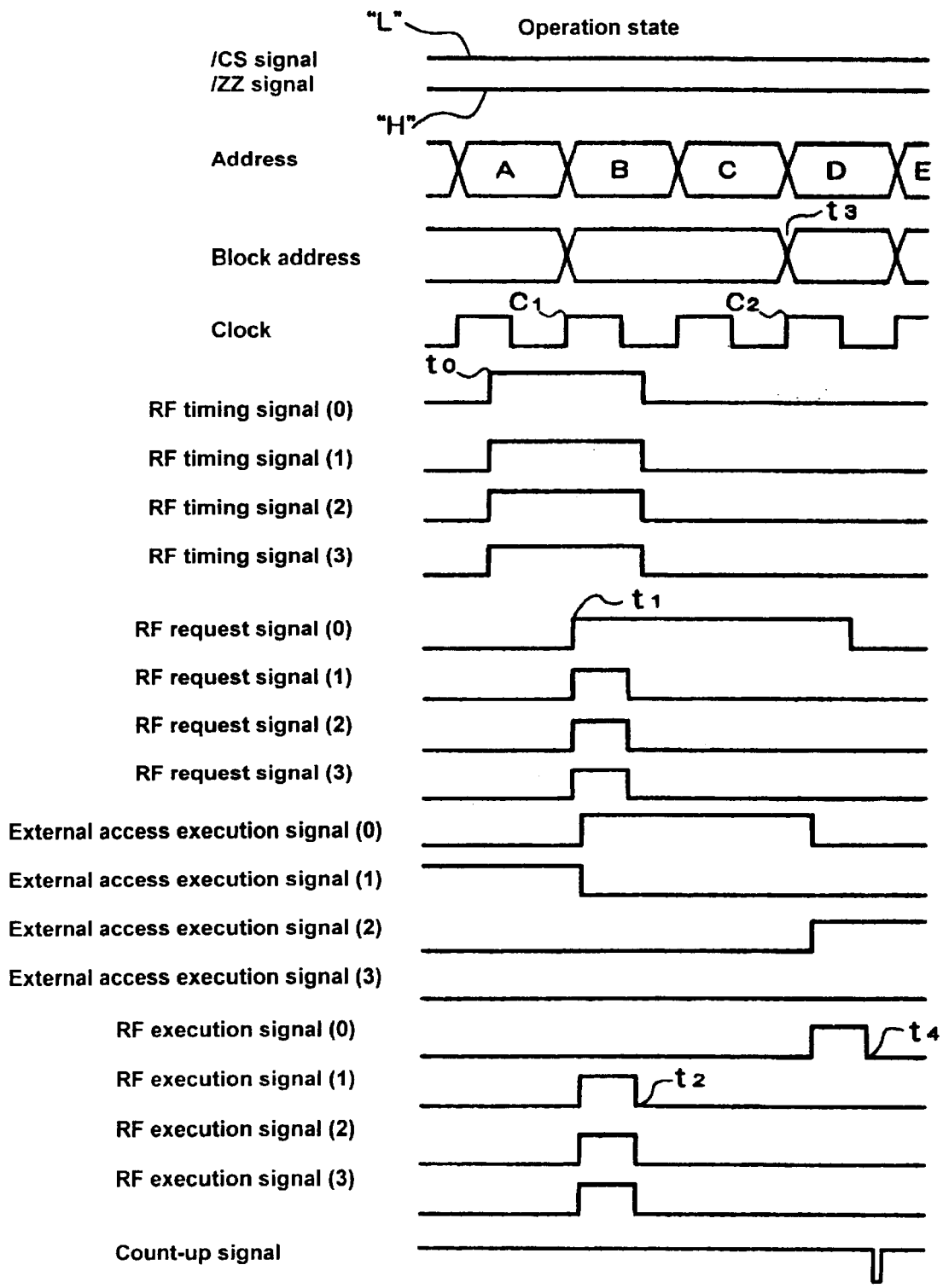
FIG. 2 shows a timing chart to describe an operation state of the semiconductor device in accordance with one embodiment of the present invention.

A refresh operation when the semiconductor device 1 is in the operation state is described using FIG. 1 and FIG. 2. FIG. 2 is a timing chart to describe the operation state of the semiconductor device 1. Since the chip select signal /CS is at L level, and the snooze signal /ZZ is at H level, the operation state takes place.

Addresses are addresses of memory cells that are externally accessed. The addresses are defined by the block address signals $A_0$ and $A_1$, the column address signals $A_2$~$A_7$, and the row address signals $A_8$~$A_{19}$.

Block addresses are addresses of the blocks 22 to be selected (in other words, the blocks 22 to which memory cells to be externally accessed belong). For example, an address A is present in the block (1) 22B, addresses B and C are present in the block (0) 22A, and an address D is present in the block (2) 22C.

At time $t_0$, the RF timing signals (0)~(3) rise to H level (active). A contrivance therefor is described below.

Based on rising ($c_1$) of a first clock signal after the RF timing signals (0)~(3) have risen to H level, and the above-described rising of the RF timing signals (0)~(3), the RF request signals (0)~(3) become H level (active) (at time $t_1$). A contrivance therefor is described below.

At time $t_1$, the block (0) is selected. Based on rising ($c_1$) of the clock signal and the selection of the block (0), the block (0) control 40A outputs an external access execution signal (0) at H level (active). On the other hand, the remaining block controls 40 output RF execution signals (1)~(3) based on the rise ($c_1$) of the clock signal and the RF request signals (1)~(3). The operations are described below.

After time $t_1$, a memory cell to be externally accessed (which is located in the block (0)) is externally accessed by the external access execution signal (0). In other words, an external access (for example, wiring or reading) operation is conducted for a memory cell that is selected by the row decoder 24A and the column decoder 26A. On the other hand, in the remaining blocks, a refresh operation is conducted for memory cells to be refreshed (for example, those in an n-th row) by the RF execution signals (1)~(3). The operations are described below.

After a period of time required for refreshing has passed, the RF request signals (1)~(3) become L level (non-active). As a result, the RF execution signals (1)~(3) become L level (non-active), whereby the refreshing is completed (at time $t_2$). A contrivance therefor is described below.

While the block address is selecting the block (0), refreshing of memory cells in the n-th row to be refreshed in the block (0) 22A is postponed. When the block address is changed from the block (0) to another block, refreshing of the memory cells in the n-th row to be refreshed in the block (0) is performed. This is described in greater detail. At time $t_3$ (when the clock signal rises ($c_2$)), the block address is changed from the block (0) 22A to the block (2) 22C. Since the RF request signal (0) is at H level (active), the block (0) control 40A outputs a RF execution signal (0) at H level based on the rise ($c_2$) of the clock signal and the RF request signal (0) at H level.

As a result, in the block (0) 22A, memory cells in the same row (the n-th row) that is refreshed in each of the other blocks 22 during the selection period of the block (0) are refreshed. After a period of time required for refreshing has passed, the RF request signal (0) becomes L level. As a result, the RF execution signal (0) becomes L level, whereby the refreshing is completed (at time $t_4$).

By the above operations, refreshing for the memory cells that are selected by the word line in the n-th row in the blocks (0)~(3) in the operation state is completed.

It is noted that the word line in the n-th row in each of the blocks 22 has the following two meanings. In the present embodiment, it is to be understood that either of them is acceptable. The first one means word lines that are located in the geometrically same positions in each of the blocks 22. The second one means word lines that are located in the same row in address space in each of the blocks 22, in other words, word lines located in the same row as viewed from the block control 40. In the second meaning, word lines in the n-th row in each of the blocks 22 are not necessarily located at the same geometrically same positions.

Figure 3:
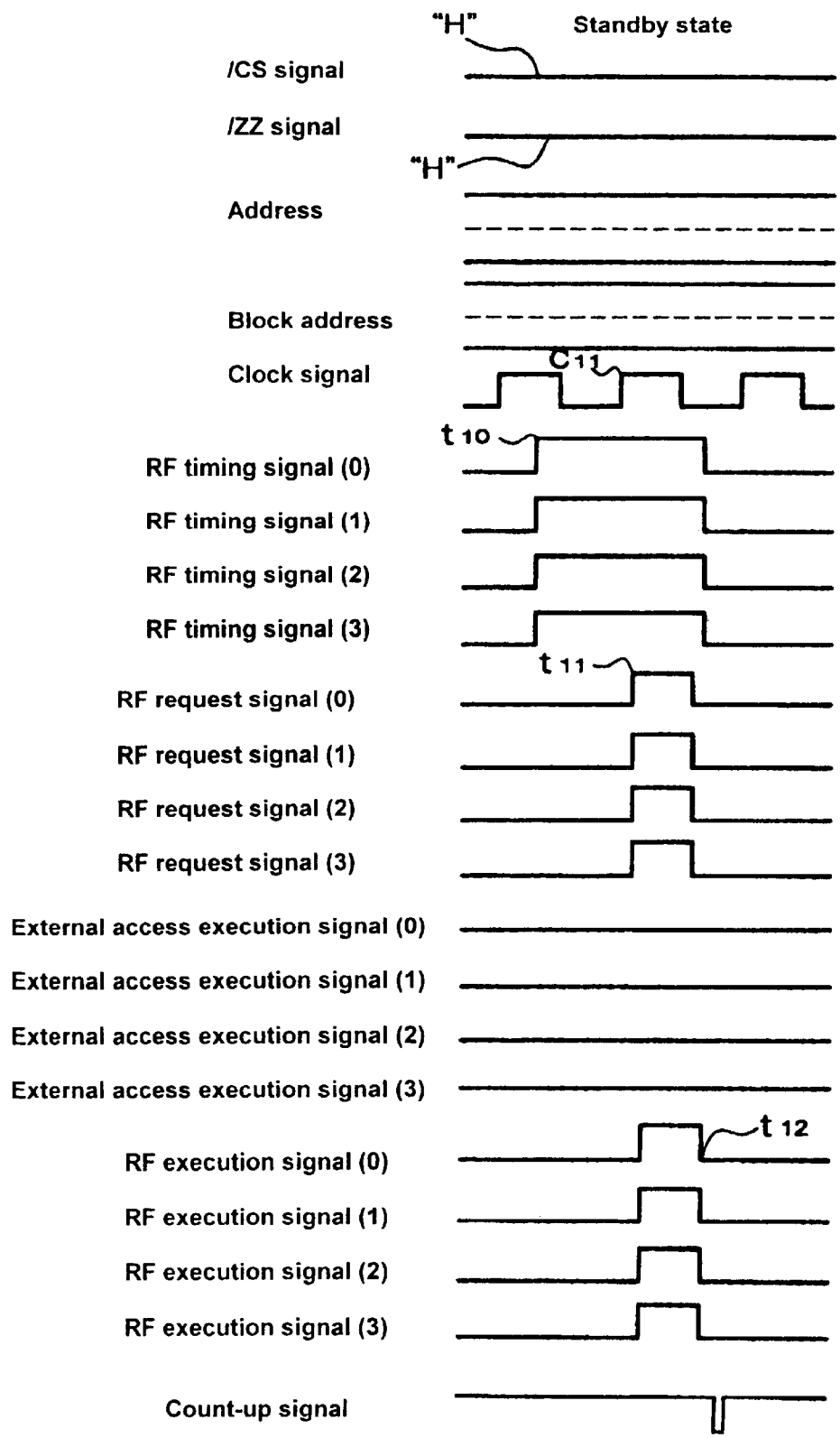
FIG. 3 shows a timing chart to describe a standby state of the semiconductor device in accordance with one embodiment of the present invention.

Next, a refresh operation while the semiconductor device 1 is in the standby state is described using FIG. 1 and FIG. 3. FIG. 3 shows a timing chart to described a standby state of the semiconductor device 1. Since the chip select signal /CS is at H level, and the snooze signal /ZZ is at H level, the standby state takes place.

At time $t_{10}$, the RF timing signals (0)~(3) become H level. The RF request signals (0)~(3) become H level (active) based on rising ($c_{11}$) of a first clock signal (at time $t_{11}$) after the RF timing signals (0)~(3) have become H level. A contrivance therefor is described below.

In the standby state, none of the blocks (0)~(3) are selected, and therefore the block controls 40 output RF execution signals (0)~(3) at H level. As a result, in the blocks (0)~(3), memory cells in the row to be refreshed are refreshed. After a period of time required for refreshing has passed, the RF request signals (0)~(3) become L level. As a result, the RF execution signals (0)~(3) become L level, whereby the refreshing is completed (at time $t_{12}$).

By the steps described above, during the standby state, refreshing of the memory cells that are connected to the word line in a row to be refreshed (for example, the n-th row) in the blocks (0)~(3) is completed.

Figure 4:
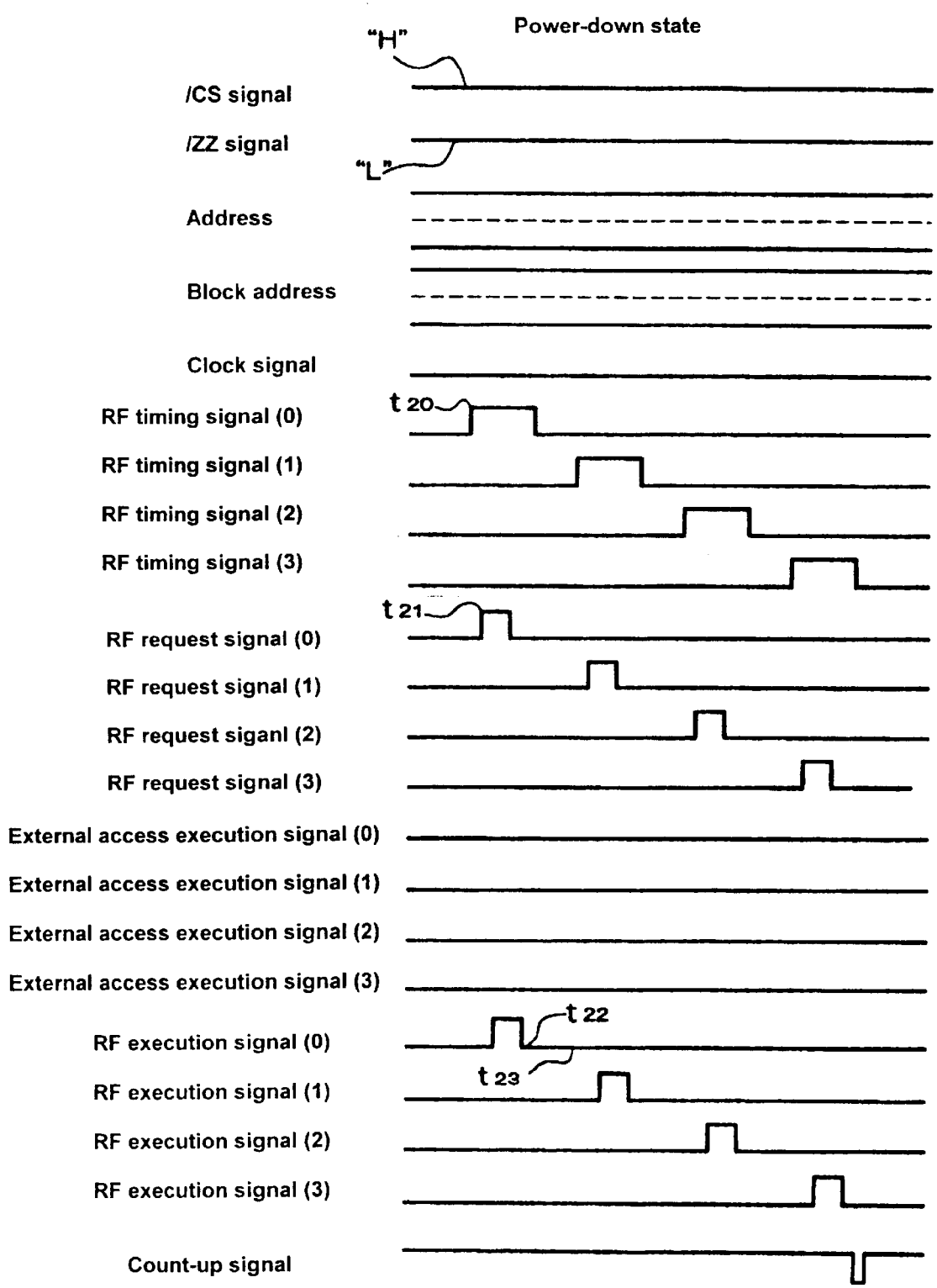
FIG. 4 shows a timing chart to describe a power-down state of the semiconductor device in accordance with one embodiment of the present invention.

Next, a refresh operation when the semiconductor device 1 is in the power-down state is described, using FIG. 1 and FIG. 4. FIG. 4 shows a timing chart to described a power-down state of the semiconductor device 1. Since the chip select signal /CS is at H level, and the snooze signal /ZZ is at L level, the power-down state takes place.

During the power-down state, the clock 130 stops generating a clock signal. Accordingly, a refresh operation is conducted based on rising of the RF timing signal (0). More specifically, at time $t_{20}$, the RF timing signal (0) rises to H level (active). By this, the RF request signal (0) becomes H level (active) (at time $t_{21}$). A contrivance therefor is described below.

Since the block (0) 22A is not selected in the power-down state, the block control 40 outputs a RF execution signal (0) at H level. As a result, in the block (0) 20A, memory cells in the row to be refreshed are refreshed. When a period of time required for refreshing has passed, the RF request signal (0) becomes L level. As a result, the RF execution signal (0) becomes L level, whereby the refreshing is completed (at time $t_{22}$).

Next, the RF timing signal (1) rises to H level with a time difference provided with respect to the period in which the RF timing signal (0) is at H level. In a similar manner as occurred when the RF timing signal (0) becomes H level, memory cells in a row to be refreshed are refreshed in the block (1) 20B.

Next, the RF timing signal (2) rises to H level with a time difference provided with respect to the period in which the RF timing signal (1) is at H level. In a similar manner as occurred when the RF timing signal (0) becomes H level, memory cells in a row to be refreshed are refreshed in the block (2) 20C.

Next, the RF timing signal (3) rises to H level with a time difference provided with respect to the period in which the RF timing signal (2) is at H level. In a similar manner as occurred when the RF timing signal (0) becomes H level, memory cells in a row to be refreshed are refreshed in the block (3) 20D. It is noted that the operation to provide time differences between the periods in which the RF timing signals (0)~(3) are at H level during the power-down state is described below.

By the above operations, refreshing for the memory cells that are connected to a word line in a row to be refreshed (for example, the n-th row) in the blocks (0)~(3) during the power-down state is completed.

The above describes a refresh operation of the semiconductor device 1.

In accordance with the present embodiment, after refreshing is performed for memory cells that are selected by the word line in the n-th row in each of the blocks 22, refreshing is performed for memory cells that are selected by the word line in the (n+1)-th row in each of the blocks 22. Then, when refreshing is performed for memory cells that are selected by the word line in the last row (in the present embodiment, the 4095th row), refreshing is performed for memory cells that are selected by the word line in the first row (the 0th row). A series of the above operations is repeated.

The present embodiment provide many advantages. For example, as shown in FIG. 2, in accordance with the present embodiment, in the operation state, while one of the blocks 22 (for example, the block (0) 22A) is externally accessed, memory cells in rows to be refreshed in all of the remaining blocks 22 other than the externally accessed block 22 (for example, the block (1) 22B, the block (2) 22C and the block (3) 22D) are refreshed. Accordingly, the semiconductor device 1 can be effectively operated.

Also, in accordance with the present embodiment, the peak current can be lowered in an externally inaccessible state such as in the power-down state. In other words, when the number of blocks to be simultaneously refreshed increases, the peak current becomes large. In accordance with the present invention, since refreshing of each of the plurality of blocks 22 is conducted with a time difference being provided therebetween, the peak current can be lowered. Accordingly, in accordance with the present invention, a small size battery such as a button battery can be used as a back-up power supply source. It is noted that, in accordance with the present embodiment, refreshing of each of the plurality of blocks 22 is conducted with a time difference being provided therebetween during the power-down state. However, it is to be understood that a time difference may be provided between refreshing of at least one block among the plurality of blocks 22 and refreshing of the remaining blocks. This can also reduce the peak current at the refreshing.

Also, in accordance with the present embodiment, refreshing can be conducted for three of the blocks 22 at once in the operation state, and a time difference is provided for refreshing for each of the plurality of blocks 22 in the power-down state. For this reason, the number of memory cells to be refreshed at once is fewer in the power-down state than in the operation state. Therefore, this can lower the peak current compared to the case in which the number of memory cells to be refreshed at once is the same in the operation state and the power-down state, or is greater in the power-down state than in the operation state.

Also, in accordance with the present embodiment, in the operation state, refreshing is performed based on the clock signal as shown in FIG. 2. In a block in which refreshing is started during one cycle of the clock signal, refreshing of memory cells in the row to be refreshed is completed during this cycle. Therefore, when a selection period for addresses of memory cells to be externally accessed (for example, the selection period for D shown in FIG. 2) is completed, and the next selection period for addresses of memory cells to be externally accessed (for example, the selection period for E shown in FIG. 2) starts, a refreshing is not performed for the memory cells to be externally accessed next, and therefore the external access is not delayed. To achieve this effect, the cycle of the clock signal of the clock 130 (for example, 50 ns~100 ns) may be made longer than the period in which a RF execution signal is at H level (for example, 20 ns~40 ns). In other words, the period between the start of refreshing and its completion is generally the same as the period in which a RF execution signal is at H level. Accordingly, the cycle of the clock signal may be made longer than the period in which a RF execution signal is at H level.

Also, in accordance with the present embodiment, the block (0) 22A~the block (3) 22D are selected by the block address signals $A_0$ and $A_1$. In other words, lower addresses among the externally provided address signals $A'_0$~$A'_{19}$ are allocated to block addresses. The lower the address signals, the more often they change, and therefore they would likely change constantly for those of the blocks 22 that are externally accessed. Therefore, allocating the block address signals in the manner described above can prevent a refreshing in a certain block 22 from being continuously delayed. Therefore, the certainty of refreshing in all of the blocks 22 can be increased.

Figure 15:
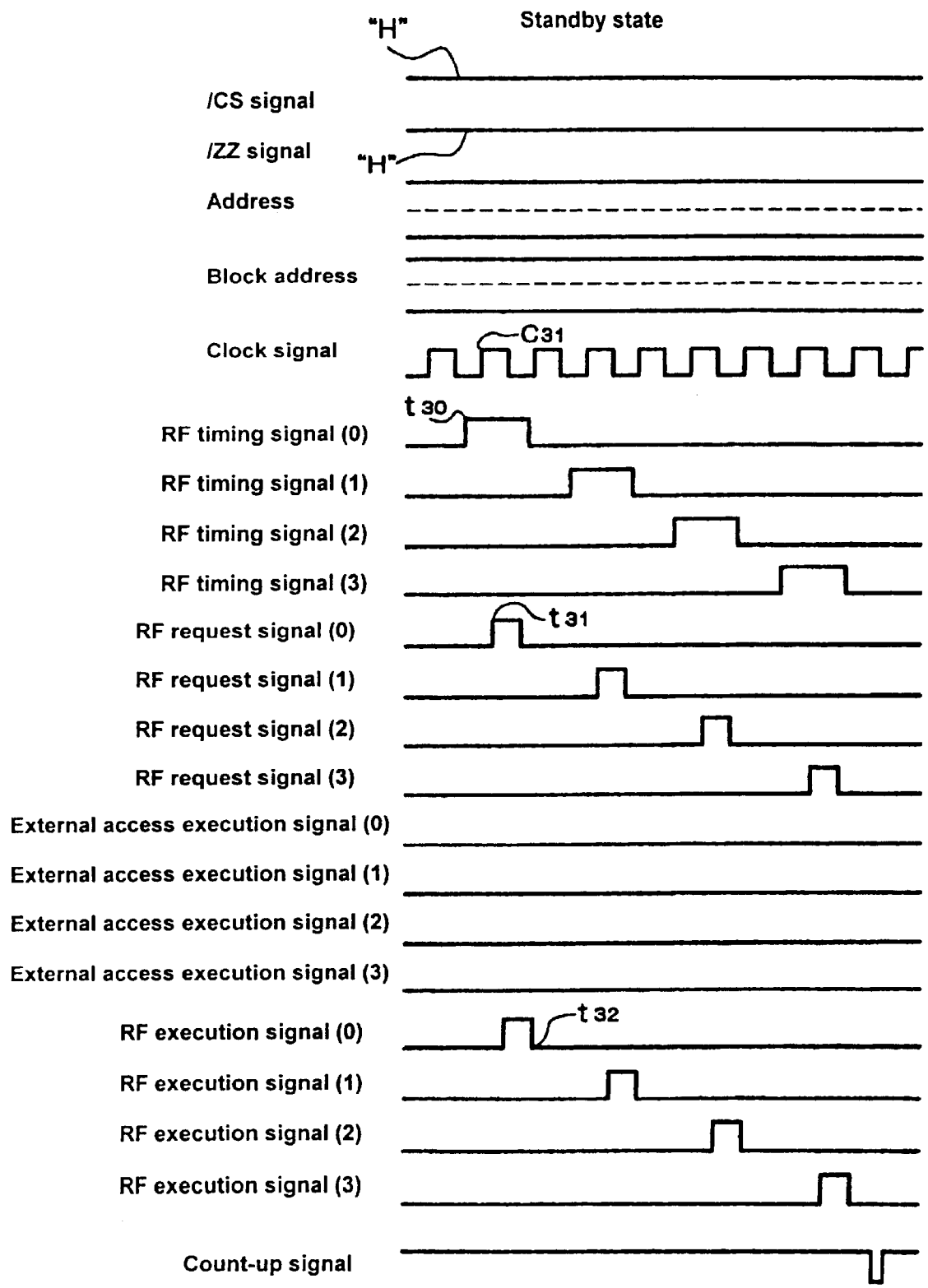
FIG. 15 shows a timing chart to describe another example of a standby state of the semiconductor device in accordance with one embodiment of the present invention.

It is noted that, in accordance with the present embodiment, refreshing is simultaneously performed for each of the plurality of blocks 22 in the standby state. However, even in the standby state, a time difference may be provided, in a similar manner as provided in the power-down state, between mutual refreshing operations for the plurality of blocks. This is described with reference to FIG. 15. FIG. 15 shows a timing chart to describe a standby state on the semiconductor device 1. It is noted that the cycle of the clock signal shown in FIG. 15 is the same as the cycle of the clock signal shown in FIG. 2.

At time $t_{30}$, the RF timing signal (0) rises to H level. Based on rising ($c_{31}$) of a first clock signal after the RF timing signal (0) has risen to H level, the RF request signal (0) becomes H level (active) (at time $t_{31}$).

Since the block (0) 22A is not selected in the standby state, the block control 40 outputs a RF execution signal (0) at H level. As a result, in the block (0) 20A, memory cells in the row to be refreshed are refreshed. When a period of time required for refreshing has passed, the RF request signal (0) becomes L level. As a result, the RF execution signal (0) becomes L level, whereby the refreshing is completed (at time $t_{32}$).

Next, the RF timing signal (1) rises to H level with a time difference provided with respect to the period in which the RF timing signal (0) is at H level. In a similar manner as occurred when the RF timing signal (0) becomes H level, memory cells in a row to be refreshed are refreshed in the block (1) 20B.

Next, the RF timing signal (2) rises to H level with a time difference provided with respect to the period in which the RF timing signal (1) is at H level. In a similar manner as occurred when the RF timing signal (0) becomes H level, memory cells in a row to be refreshed are refreshed in the block (2) 20C.

Next, the RF timing signal (3) rises to H level with a time difference provided with respect to the period in which the RF timing signal (2) is at H level. In a similar manner as occurred when the RF timing signal (0) becomes H level, memory cells in a row to be refreshed are refreshed in the block (3) 20D. By the above operations, refreshing for the memory cells that are connected to a word line in a row to be refreshed (for example, the n-th row) in the blocks (0)~(3) during the standby state is completed. In accordance with this example, the peak current can be lowered even in the standby state.

Figure 5:
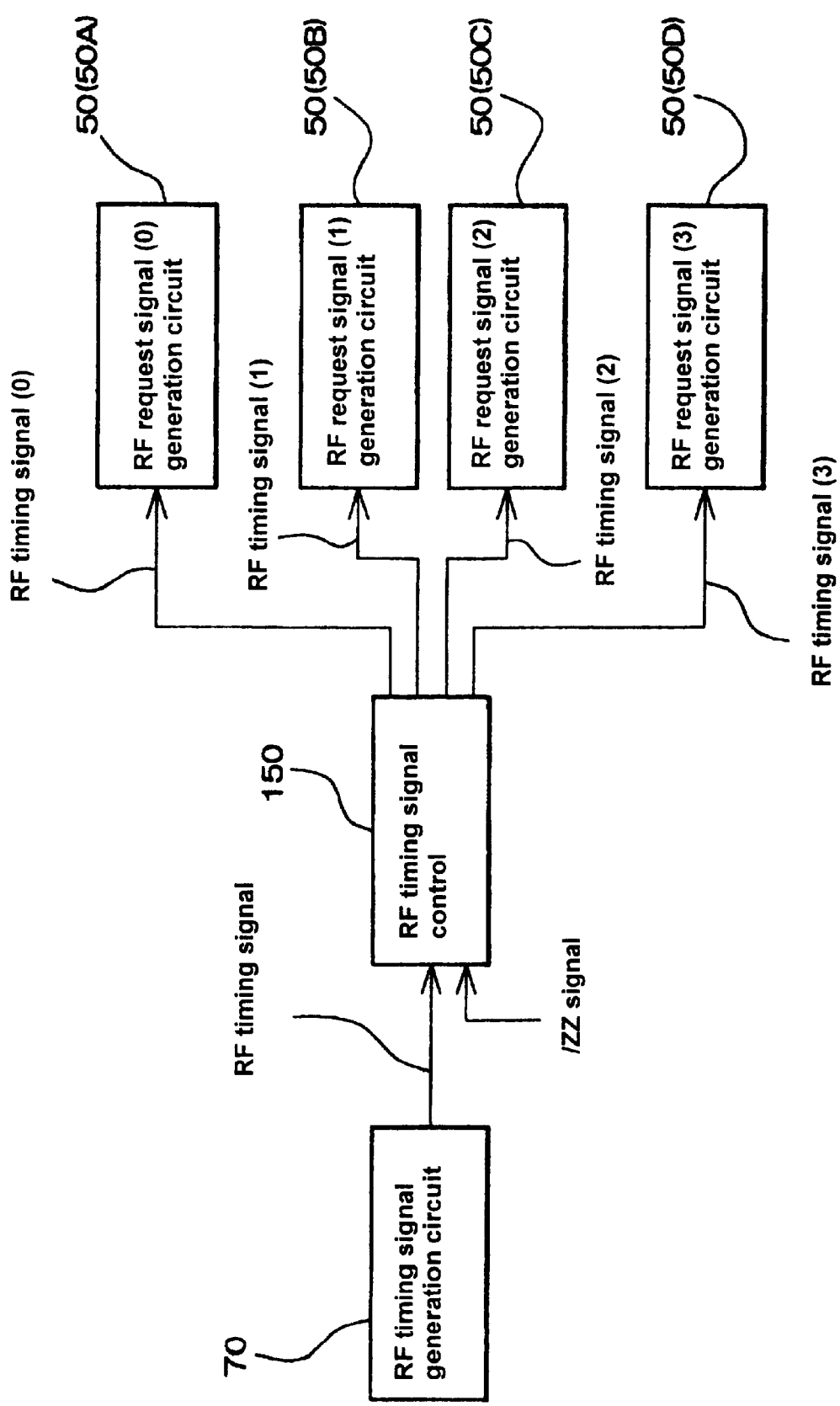
FIG. 5 shows an exemplary circuit block diagram of a RF timing signal control and its related circuits.
Figure 6:
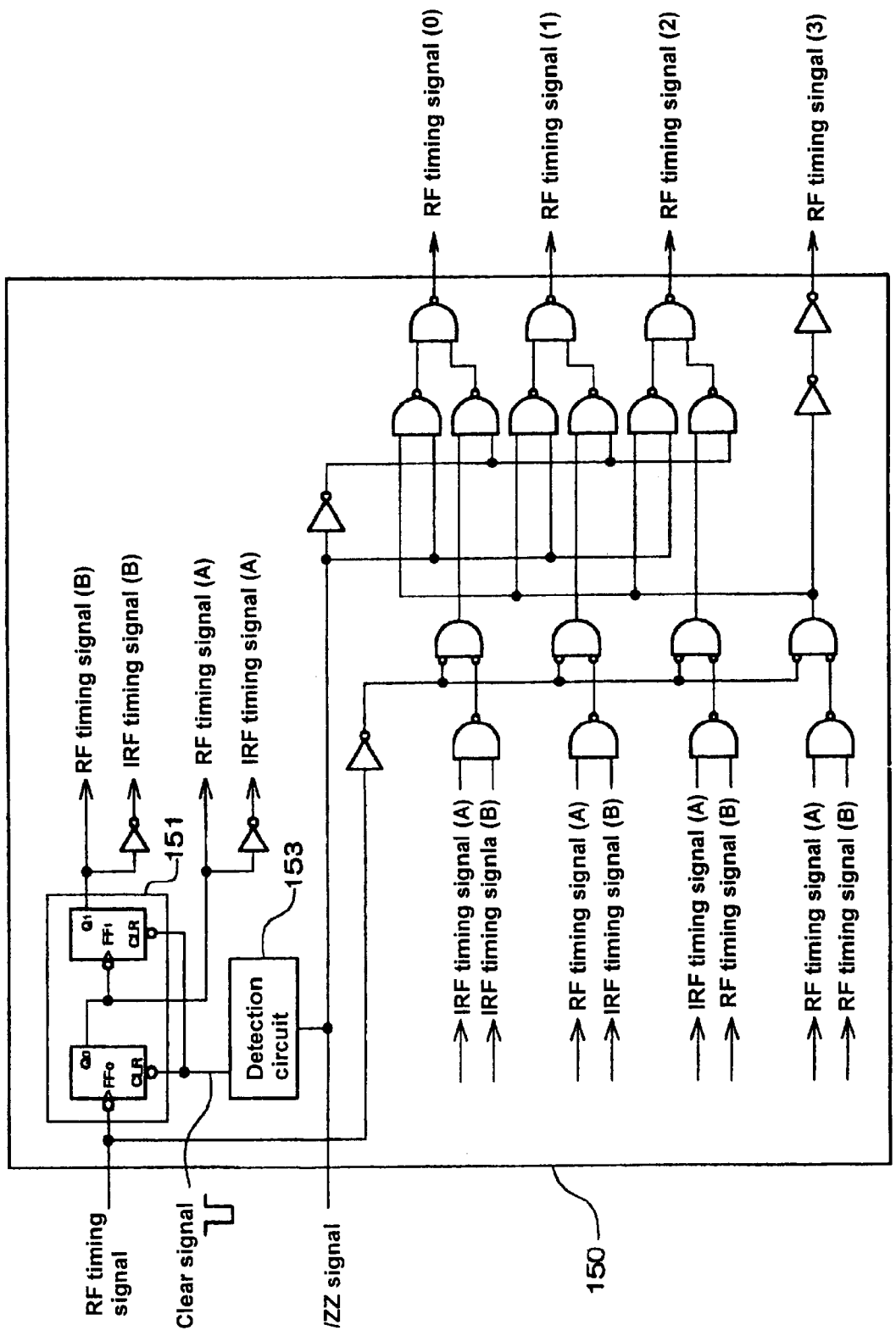
FIG. 6 shows an exemplary circuit diagram of the RF timing signal control.
Figure 7:
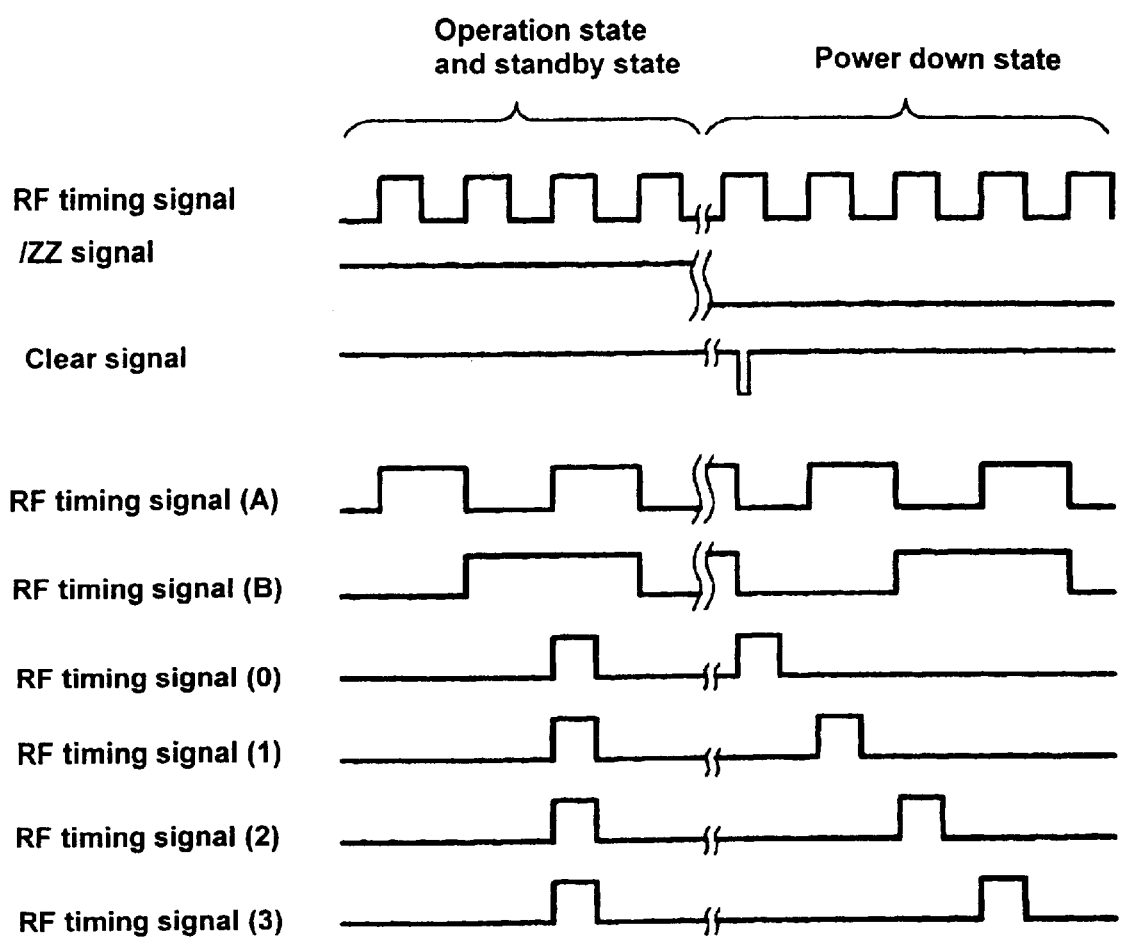
FIG. 7 shows a timing chart of RF timing signals (0)~(3)

The RF timing signal control 150 is described. FIG. 5 shows an exemplary block diagram of the RF timing signal control 150 and its related circuits. FIG. 6 shows an exemplary circuit diagram of the RF timing signal control 150. FIG. 7 shows a timing chart of RF timing signals (0)~(3).

As shown in FIG. 7, during the operation state and the standby state, the RF timing signal control 150 does not provide time differences between the periods in which the RF timing signals (0)~(3) are at H level. On the other hand, in the power-down state, time differences are provided mutually between the periods in which the RF timing signals (0)~(3) are at H level. As a result, time differences can be provided mutually between refreshing operations for the plurality of blocks 22, whereby the peak current is lowered. A structure for providing time differences between the periods in which the RF timing signals (0)~(3) are at H level is described with reference to FIGS. 5 through 7.

The RF timing signal from the RF timing signal generation circuit 70 is input in a clock terminal of a flip-flop $FF_0$ that forms a counter 151 of the RF timing signal control 150. An output signal from a terminal $Q_0$ of the flip-flop $FF_0$ becomes an output signal of the counter 151. The output signal becomes a RF timing signal (A) and an IRF timing signal (A) that is a signal formed by inverting the RF timing signal (A).

Also, an output signal from the terminal $Q_0$ is input in a clock terminal of a flip-flop $FF_1$ that forms the counter 151. An output signal from a terminal $Q_1$ of the flip-flop $FF_1$ becomes an output signal of the counter 151. The output signal becomes a RF timing signal (B) and an IRF timing signal (B) that is a signal formed by inverting the RF timing signal (B).

Then, the RF timing signal (A), the IRF timing signal (A), the RF timing signal (B) and the IRF timing signal (B) flow through a logical circuit in the RF timing signal control 150, whereby the RF timing signal control 150 outputs the RF timing signals (0)~(3). The logical circuit is structured such that, when both of the RF timing signal (A) and RF timing signal (B) become H level in the operation state or the standby state, the RF timing signals (0)~(3) become H level.

The counter 151 generates the RF timing signal (A), the IRF timing signal (A), the RF timing signal (B) and the IRF timing signal (B) in the same manner as described above. However, the operation state (the /ZZ signal is at H level) or the standby state (the /ZZ signal is at H level) changes to the power-down state (the /ZZ signal is at L level), the detection circuit 153 shown in FIG. 6 detects the change, and generates a clear signal in a pulse shape. The clear signal clears the counter 151, whereby all of the RF timing signal (A), the IRF timing signal (A), the RF timing signal (B) and the IRF timing signal (B) are brought to L level. Then, counting of the RF timing signal is started.

Figure 8:
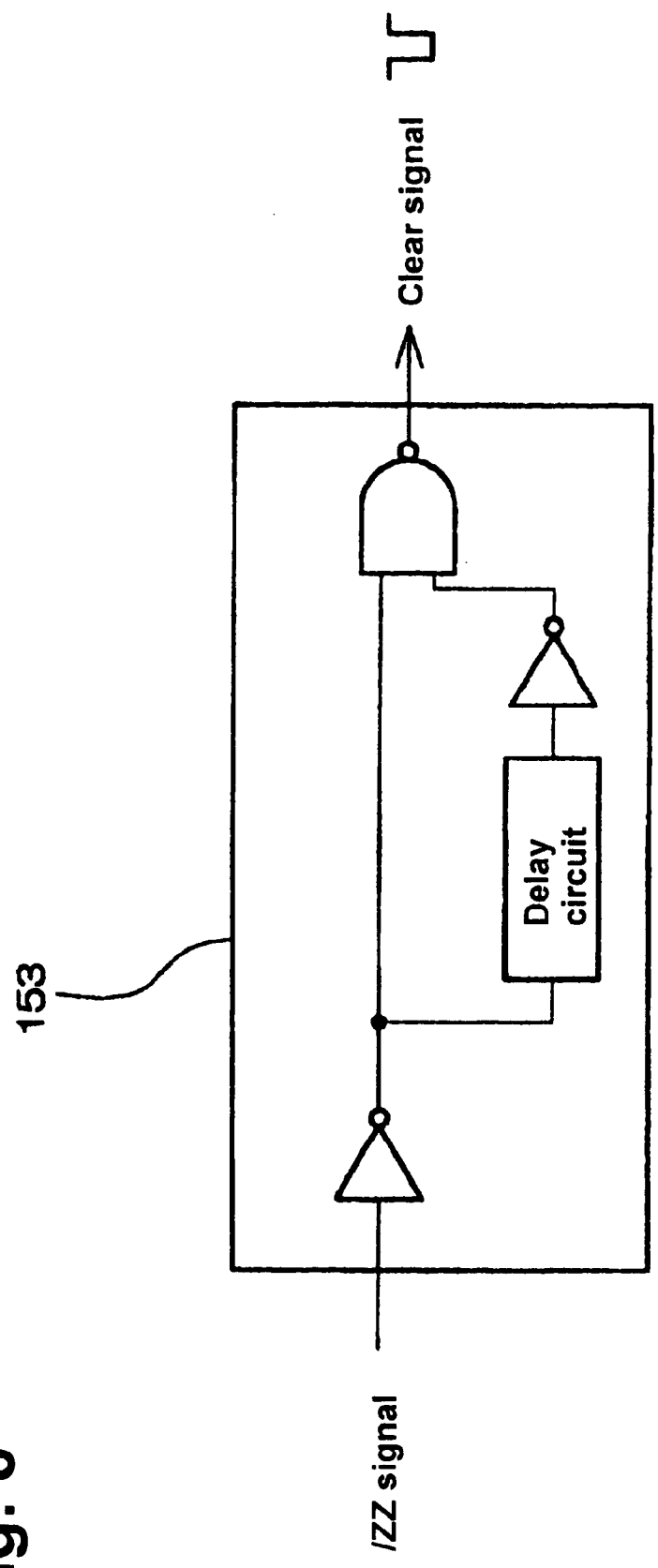
FIG. 8 shows a circuit diagram of a detection circuit that is provide in the RF timing signal control.

FIG. 8 shows an exemplary circuit diagram of the detection circuit 153. The circuit of the detection circuit 153 is structured to generate a clear signal in a pulse shape, when the /ZZ signal at H level changes to the /ZZ signal at L level.

As described above, the RF timing signal (A), the IRF timing signal (A), the RF timing signal (B) and the IRF timing signal (B) flow through the logical circuit in the RF timing signal control 150, whereby the RF timing signal control 150 outputs the RF timing signals (0)~(3). The logical circuit is structured to achieve the following states (A)~(D) in the power-down state.

(A) When the RF timing signal (A) is at L level, and the RF timing signal (B) is at L level, a RF timing signal (0) at H level is output, and RF timing signals (1), (2) and (3) at L level are output.

(B) When the RF timing signal (A) is at H level, and the RF timing signal (B) is at L level, a RF timing signal (1) at H level is output, and RF timing signals (0), (2) and (3) at L level are output.

(C) When the RF timing signal (A) is at L level, and the RF timing signal (B) is at H level, a RF timing signal (2) at H level is output, and RF timing signals (0), (1) and (3) at L level are output.

(D) When the RF timing signal (A) is at H level, and the RF timing signal (B) is at H level, a RF timing signal (3) at H level is output, and RF timing signals (0), (1) and (2) at L level are output.

Figure 9:
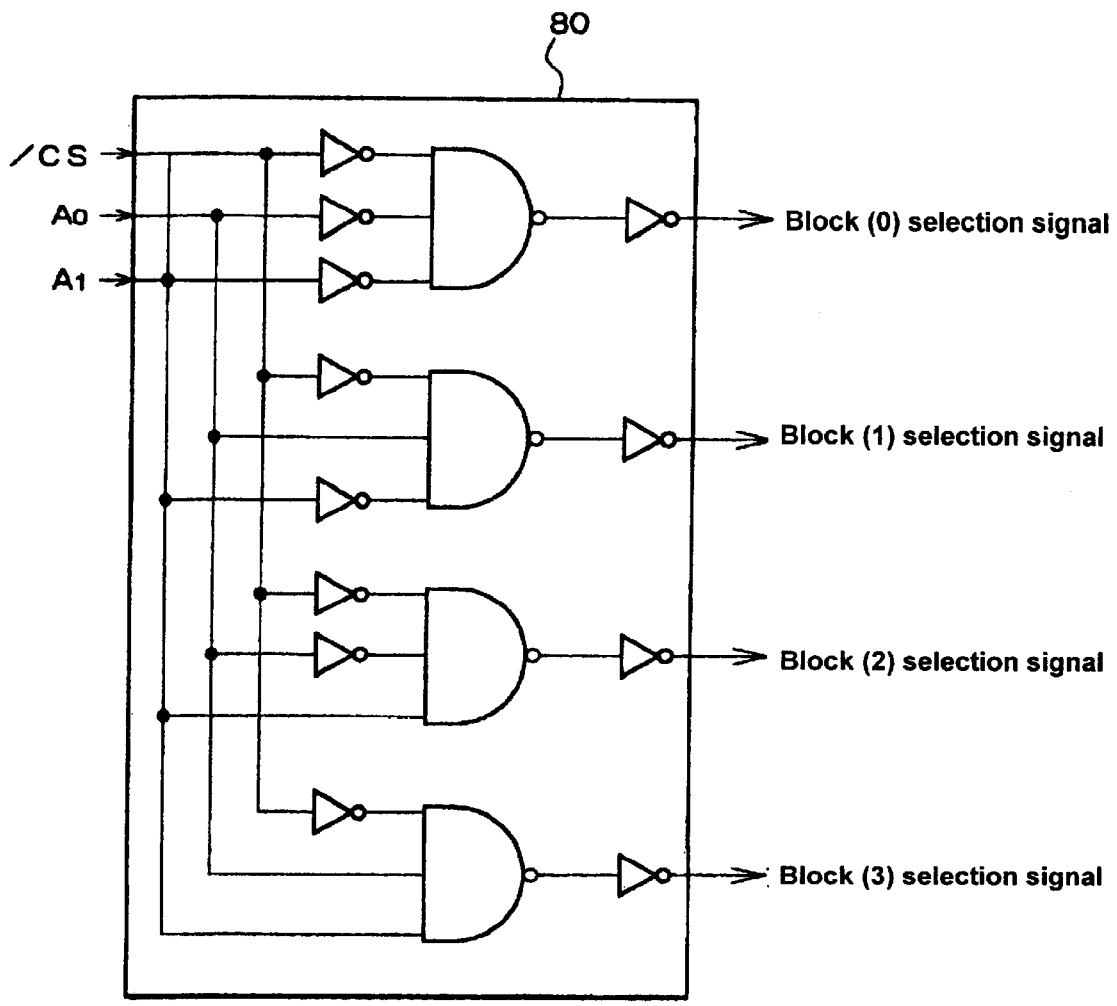
FIG. 9 shows an exemplary circuit block diagram of a block selection signal generation circuit that is provided in the semiconductor device in accordance with one embodiment of the present invention.

Next, the block selection signal generation circuit 80 is described in detail with reference to FIG. 9. FIG. 9 shows an exemplary circuit block diagram of the block selection signal generation circuit 80. The chip select signal /CS and the block address signals $A_0$ and $A_1$ are input in the block selection signal generation circuit 80. The block selection signal generation circuit 80 outputs block (0) selection signal~block (3) selection signal. The block selection signal generation circuit 80 is structured to have a logical circuit such that achieves the following (A)~(E).

(A) When the chip select signal /CS is at L level, and the block address signals ($A_0$ and $A_1$) are at (L level and L level), the block selection signal generation circuit 80 outputs a block (0) selection signal at H level (active), as well as a block (1) selection signal, a block (2) selection signal and a block (3) selection signal at L level (non-active).

(B) When the chip select signal /CS is at L level, and the block address signals ($A_0$ and $A_1$) are at (H level and L level), the block selection signal generation circuit 80 outputs a block (1) selection signal at H level (active), as well as a block (0) selection signal, a block (2) selection signal and a block (3) selection signal at L level (non-active).

(C) When the chip select signal /CS is at L level, and the block address signals ($A_0$ and $A_1$) are at (L level and H level), the block selection signal generation circuit 80 outputs a block (2) selection signal at H level (active), as well as a block (0) selection signal, a block (1) selection signal and a block (3) selection signal at L level (non-active).

(D) When the chip select signal /CS is at L level, and the block address signals ($A_0$ and $A_1$) are at (H level and H level), the block selection signal generation circuit 80 outputs a block (3) selection signal at H level (active), as well as a block (0) selection signal, a block (1) selection signal and a block (2) selection signal at L level (non-active).

(E) When the chip select signal /CS is at H level, the block selection signal generation circuit 80 outputs a block (0) selection signal, a block (1) selection signal, a block (2) selection signal and a block (3) selection signal at L level (non-active).

Figure 10:
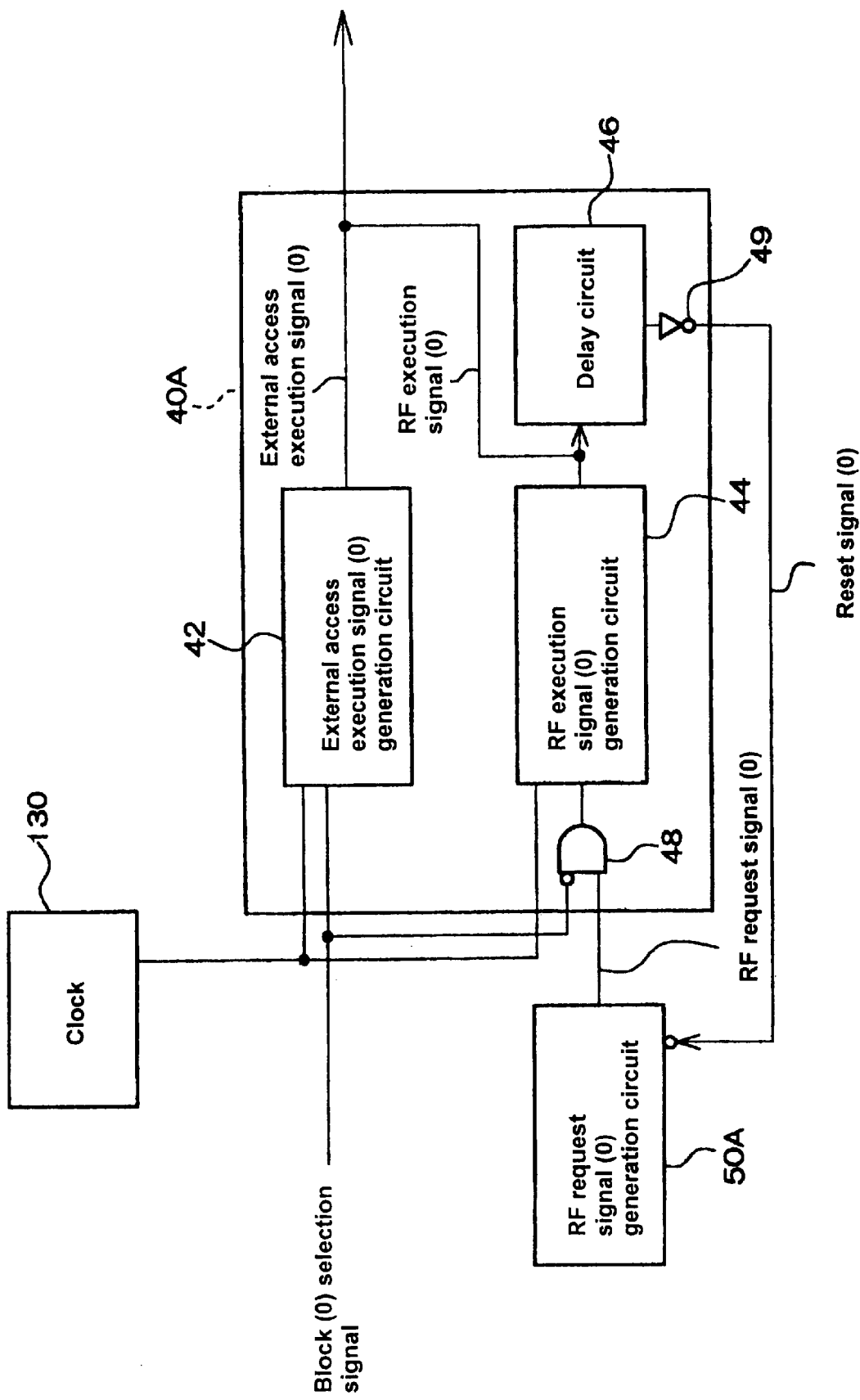
FIG. 10 shows an exemplary circuit block diagram of a block (0) control that is provided in the semiconductor device in accordance with one embodiment of the present invention and its relating circuits.

Next, the block controls 40 are described in detail by referring to the block (0) control 40A as an example. FIG. 10 shows an exemplary circuit block diagram of the block (0) control 40A and its relating circuits. The block (0) control 40A can be equipped with an external access execution signal (0) generation circuit 42, a RF execution signal (0) generation circuit 44, a delay circuit 46, an AND gate 48 and an inverter 49.

An operation that takes place when the block (0) 22A is selected (externally accessed) is described. In this case, a block (0) selection signal at H level (active) is input in the block (0) control 40A. As a result, the block (0) selection signal at H level is input in the AND gate 48. As a result, the AND gate 48 outputs a signal at L level, and the signal at L level is input in the RF execution signal (0) generation circuit 44.

In the meantime, the block (0) selection signal at H level is input in the external access execution signal (0) generation circuit 42.

A clock signal from the clock 130 is input in the external access execution signal (0) generation circuit 42 and RF request signal (0) generation circuit 44. Since the block (0) selection signal at H level is input in the external access execution signal (0) generation circuit 42, the external access execution signal (0) generation circuit 42 outputs, based on the clock signal, an external access execution signal (0) at H level (active). It is noted that, since the signal at L level from the AND gate 48 is input in the RF execution signal (0) generation circuit 44, the RF execution signal (0) generation circuit 44 outputs a RF execution signal (0) at L level (non-active). The external access execution signal (0) at H level becomes an output signal of the block (0) control 40A.

Next, an operation that takes place when the block (0) 22A is not selected (not externally accessed) is described. A block (0) selection signal at L level (non-active), and a RF request signal (0) at H level (active) are input in the block (0) control 40A. As a result, the block (0) selection signal at L level and the RF request signal (0) at H level are input in the AND gate 48. As a result, the AND gate 48 outputs a signal at H level, and the signal at H level is input in the RF execution signal (0) generation circuit 44.

In the meantime, the block (0) selection signal at L level is input in the external access execution signal (0) generation circuit 42.

A clock signal from the clock 130 is input in the external access execution signal (0) generation circuit 42 and the RF request signal (0) generation circuit 44. Since the signal at H level from the AND gate 48 is input in the RF execution signal (0) generation circuit 44, the RF execution signal (0) generation circuit 44 outputs, based on the clock signal, a RF execution signal (0) at H level (active). It is noted that, since the block (0) selection signal at L level is input in the external access execution signal (0) generation circuit 42, the external access execution signal (0) generation circuit 42 outputs an external access execution signal (0) at L level (non-active). The RF execution signal (0) at H level (active) becomes an output of the block (0) control 40A.

It is noted that the RF execution signal (0) is also input in the delay circuit 46. Accordingly, the RF execution signal (0) at H level is also input in the delay circuit 46. The delay circuit 46 outputs a reset signal (0) at H level after a time required for refreshing has passed (for example, 20 ns~40 ns). The reset signal (0) is inverted by the inverter 49 to become a reset signal (0) at L level, and input in a reset (/R) of the RF request signal (0) generation circuit 50A. As a result, the RF execution signal (0) becomes L level (non-active), whereby the refreshing is completed.

The other block controls 40B~40D have the same structure and perform the same operation as those of the block (0) control 40A. In accordance with the block controls 40A~40D, in the operation state, the timing when an external access execution signal from one of the block controls 40 becomes active (H level) based on the clock signal is synchronized with the timing when RF execution signals from all the other remaining block controls 40 become active (H level).

Figure 11:
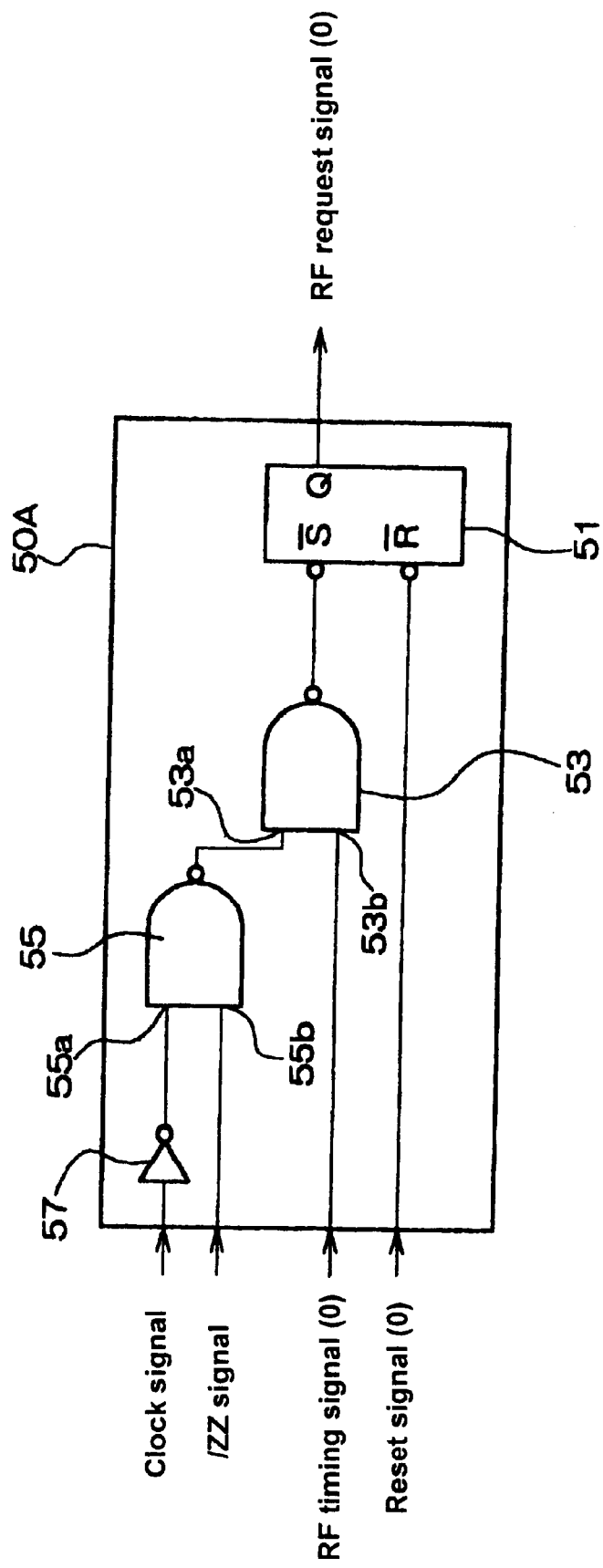
FIG. 11 shows an exemplary circuit block diagram of a RF request signal (0) generation circuit that is provided in the semiconductor device in accordance with one embodiment of the present invention.

Next, the RF request signal generation circuit 50 is described in detail with reference to the RF request signal (0) generation circuit 50A as an example. FIG. 11 shows an exemplary circuit block diagram of the RF request signal (0) generation circuit 50A. A clock signal from the clock 130, a snooze signal /ZZ from the mode control 110, an RF timing signal (0) from the RF timing signal generation circuit 150 and a reset signal (0) from the block (0) control 40A are input in the RF request signal (0) generation circuit 50A. Then, the RF request signal (0) generation circuit 50A outputs a RF request signal (0). A concrete operation of the RF request signal (0) generation circuit 50A is described.

In the operation state and the standby state of the semiconductor device 1, a snooze signal /ZZ at H level is input in an input terminal 55b of a NAND gate 55. As a clock signal at H level is input in the RF request signal (0) generation circuit 50A in a state in which a RF timing signal (0) at H level is input in an input terminal 53b of the NAND gate 53, the clock signal is inverted by an inverter 57 to become L level, and the signal at L level is input in an input terminal 55a of the NAND gate 55. As a result, a signal at H level that is output from the NAND gate 55 is input in the input terminal 53a of the NAND gate 53.

Since signals at H level are input in the input terminals 53a and 53b, the NAND gate 53 outputs a signal at L level. The signal at L level is input in a /S input of a flip-flop 51. As a result, the flip-flop is set. In the manner described above, the RF request signal (0) become H level (active).

In the power-down state of the semiconductor device 1, a snooze signal /ZZ at L level is input in the input terminal 55b of the NAND gate 55. As a result, the NAND gate 55 outputs a signal at H level. The signal at H level is input in the input terminal 53a of the NAND gate 53. In this state, when a RF timing signal at H level is input in the input terminal 53b of the NAND gate 53, the NAND gate 53 outputs a signal at L level. The signal at L level is input in the /S input of the flip-flop 51. As a result, the flip-flop 51 is set, and the flip-flop 51 outputs a RF request signal at H level. In the manner described above, the RF request signal (0) become H level (active).

The RF request signal (1) generation circuit 50B, the RF request signal (2) generation circuit 50C, and the RF request signal (3) generation circuit 50D have the same structure and operate in the same manner as those of the RF request signal (0) generation circuit 50A.

Figure 12:
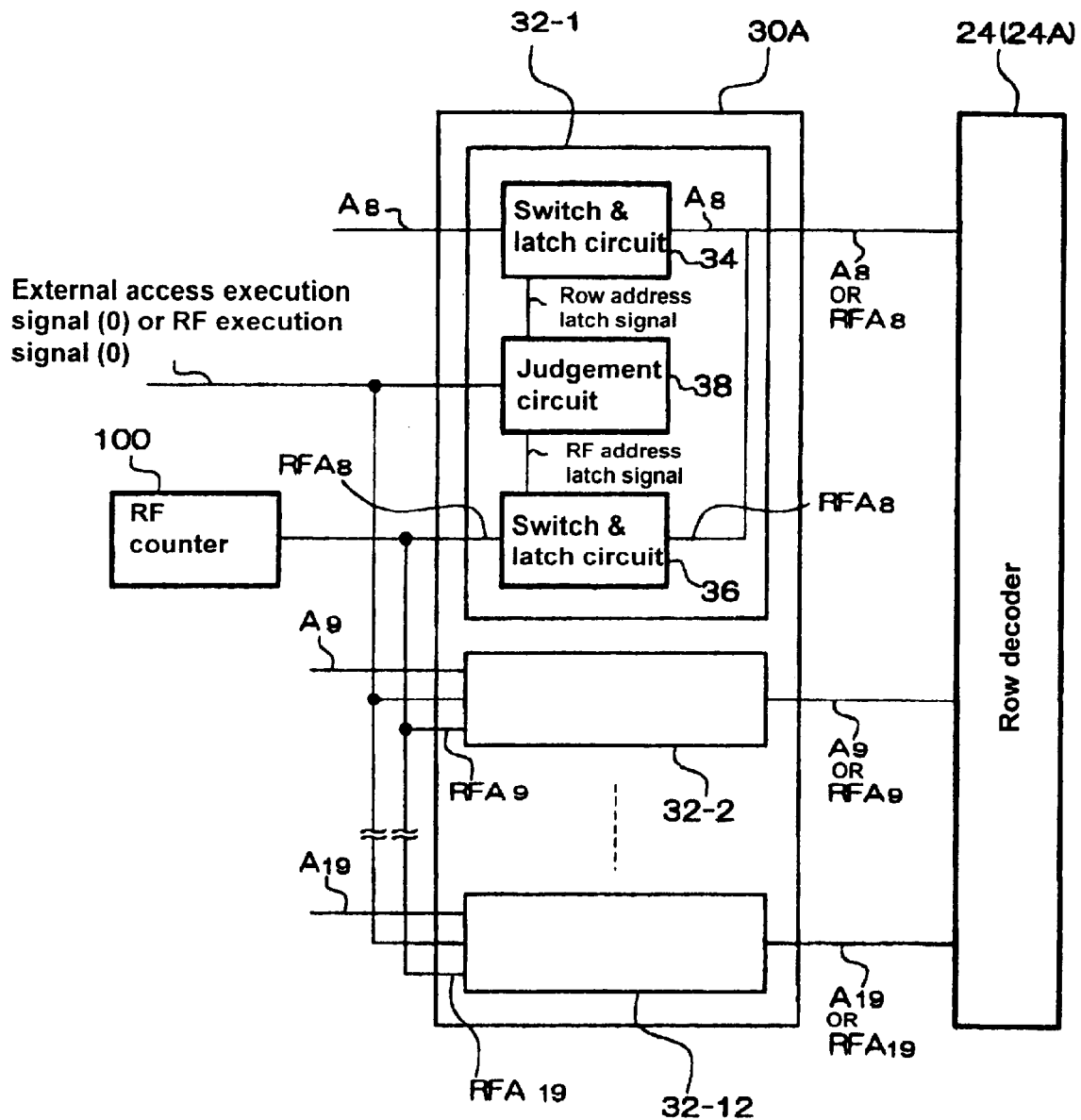
FIG. 12 shows an exemplary circuit block diagram of a row pre-decoder that is provided in the semiconductor device in accordance with one embodiment of the present invention and its relating circuits.

Next, the row pre-decoders 30A~30D are described in detail by referring to the row pre-decoder 30A as an example. FIG. 12 shows an exemplary circuit block diagram of the row pre-decoder 30A and circuits relating thereto. The row pre-decoder 30A can be equipped with selection sections in the number corresponding to the row address signals $A_8$~$A_{19}$, in other words, twelve selection sections 32-1~32-12. Each of the twelve selection sections 32-1~32-12 selects a row address signal or a refresh address signal.

Each of the selection sections 32-1~32-12 is equipped with a switch & latch circuits 34 and 36 and a judgment circuit 38. A row address signal (a row address signal $A_8$ in the case of the selection section 32-1) is input in the switch & latch circuit 34. A refresh address signal from the RF counter 100 (a refresh address signal $RFA_8$ in the case of the selection section 32-1) is input in the switch & latch circuit 36.

The judgment circuit 38 receives an input of a signal from the block (0) control 40A (FIG. 1), namely, either an external access execution signal (0) at H level or a RF execution signal (0) at H level. When the judgment circuit 38 judges that the external access execution signal (0) at H level is input in the judgment circuit 38, the judgment circuit 38 outputs a row address latch signal. The row address latch signal is input in the switch & latch circuit 34, and the switch & latch circuit 34 latches and outputs a row address signal. As a result, the row pre-decoder 30A outputs row address signals $A_8$~$A_{19}$. The row address signals $A_8$~$A_{19}$ are signals for driving word lines that select memory cells to be externally accessed. The driving signals are input in a row decoder 24A. Based on the driving signals, the row decoder 24A selects a word line to which memory cells to be externally accessed belong.

On the other hand, when the judgment circuit 38 judges that the RF execution signal (0) at H level is input in the judgment circuit 38, the judgment circuit 38 outputs a RF address latch signal. The RF address latch signal is input in the switch & latch circuit 36, and the switch & latch circuit 36 latches and outputs a refresh address signal. As a result, the row pre-decoder 30A outputs refresh address signals $RFA_8$~$RFA_{19}$. The refresh address signals $RFA_8$~$RFA_{19}$ are signals for driving word lines that select memory cells in a row to be refreshed. The driving signals are input in the row decoder 24A. Based on the driving signals, the row decoder 24A selects a word line in a row to be refreshed.

The row pre-decoders 30B~30D have the same structure and perform the same operation as those of the row pre-decoder 30A.

The RF counter control 90 generates a count-up signal after completion of refreshing the memory cells that are selected by a word line at the n-th row, in all of the blocks 22. As a result, the count value of the RF counter 100 increases by one, and the RF counter 100 outputs corresponding refresh address signals $RFA_8$~$RFA_{19}$. By the outputs from the RF counter 100, the row pre-decoders 30A~30D supply signals that drive a word line at the (n+1)th row.

Figure 13:
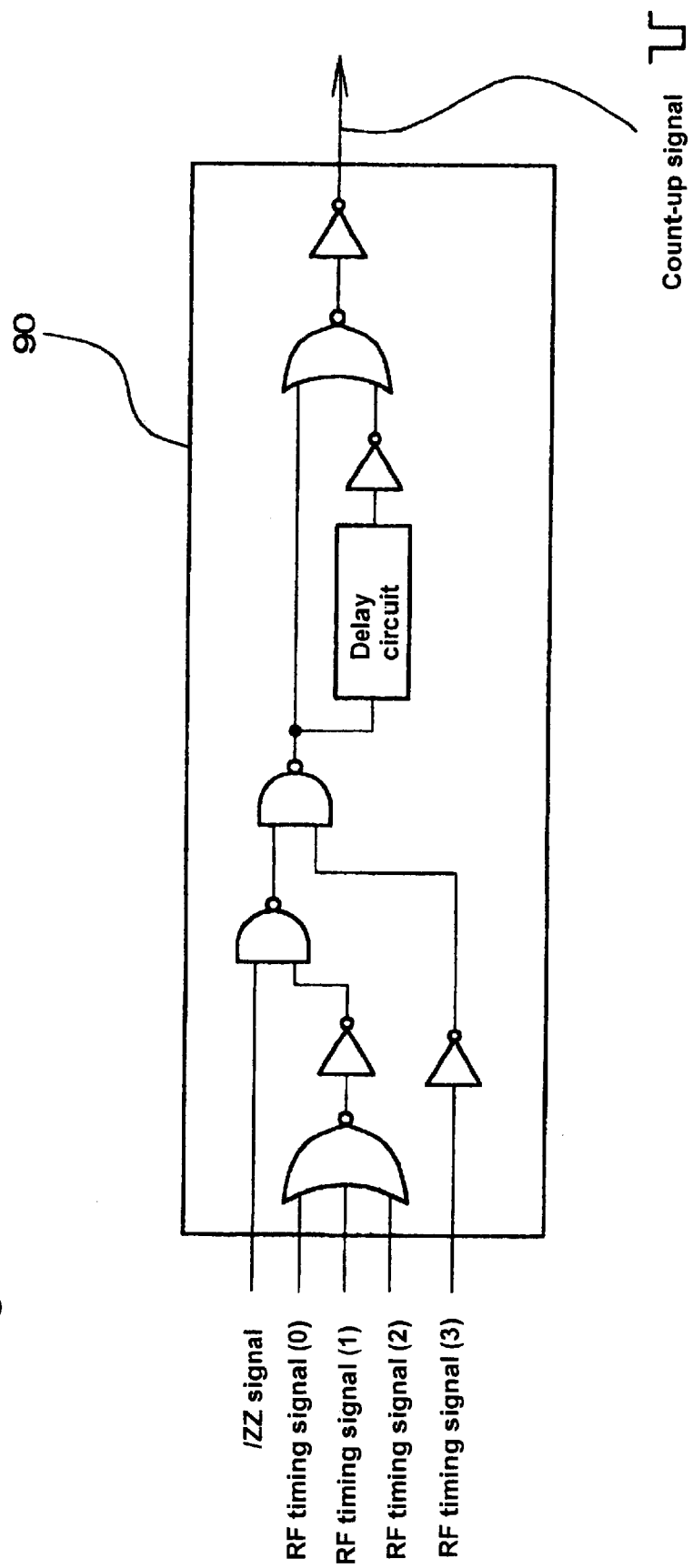
FIG. 13 shows an exemplary circuit block diagram of a RF counter that is provided in the semiconductor device in accordance with one embodiment of the present invention.

FIG. 13 shows an exemplary circuit block diagram of the RF counter control 90. The RF counter control 90 has a logical structure to achieve the following (A)~(B).

A count-up signal is generated based on the fact that the entire RF request signals (0)~(3) become L level. The reason for this is described. When memory cells located at the n-th row in each of the blocks 22 are refreshed, in the operation state, which one of the blocks 22 completes a refreshing operation last is not known. For example, if a count-up signal is generated based on the fact that the RF request signal (3) shown in FIG. 2 becomes L level, even though memory cells in the n-th row in the block (0) 22A are not refreshed, the RF counter 100 outputs refresh address signals $RFA_8$~$RFA_{19}$ for selecting memory cells in the (n +1)th row. Then, in the operation state, if a count-up signal is generated based on the fact that the entire RF request signals (0)~(3) become L level, refreshing for each of the blocks 22 can be securely performed. Also, in the standby state, a count-up signal is generated based on the fact that the entire RF request signals (0)~(3) become L level, to thereby securely perform refreshing for each of the blocks 22.

A count-up signal is generated based on the fact that the RF request signal (3) becomes L level. The reason for this is described. As shown in FIG. 4, in the power-down state, in order to provide since time differences between refreshing operations for memory cells in the n-th row in the respective blocks, time differences are provided between the periods in which the RF request signals (0)~(3) are at H level. For example, if a count-up signal is generated based on the fact that the entire RF request signals (0)~(3) become L level, even though refreshing for memory cells in the n-th row in all of the blocks 22 is not completed, the RF counter 100 outputs refresh address signals $RFA_8$~$RFA_{19}$ for selecting memory cells in the (n+1)th row. For example, in FIG. 4, a count-up signal is generated at time $t_{23}$. However, refreshing for memory cells in the n-th row in the block (1) 22B, the block (2) 22C and the block (3) 22D is not completed.

Accordingly, in the power-down state, since there is no externally access, the RF request signal (0), the RF request signal (1), the RF request signal (2), and the RF request signal (3) are activated in this order, as shown in FIG. 7. As a result, among the RF request signals (0)~(3), the RF request signal (3) becomes L level last. Therefore, is a count-up signal is generated based on the fact that the RF request signal (3) becomes L level, refreshing for each of the blocks can be securely performed.

Figure 14:
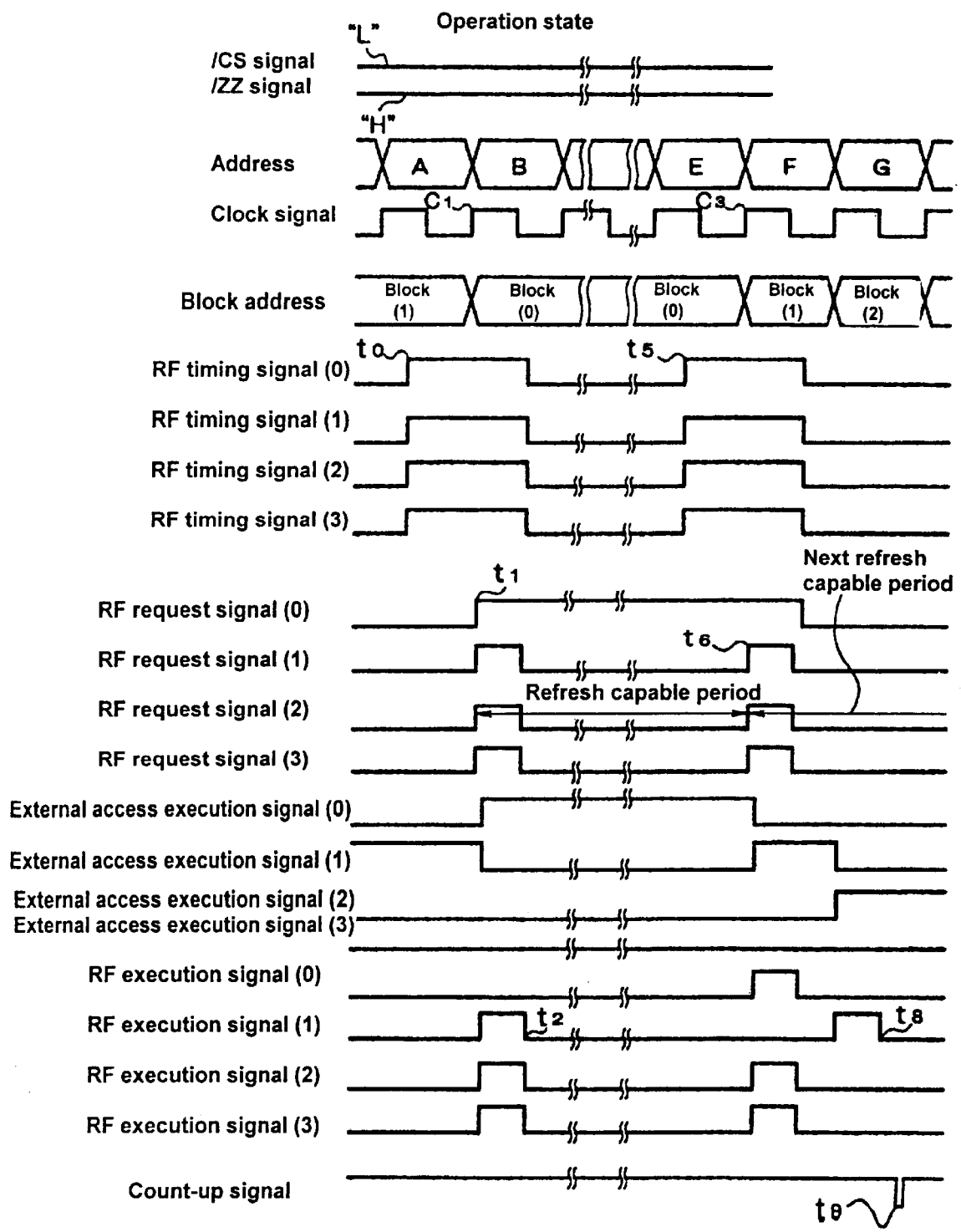
FIG. 14 shows a timing chart of an operation state in one period of the semiconductor device in accordance with one embodiment of the present invention.

It is noted that, as shown in FIG. 2, in the operation state, refreshing is postponed for a block 22 that is externally accessed, such as, for example, the block (0). By the RF counter control 90, refreshing for a block in which refreshing is postponed can be securely performed, which is described below with reference to FIG. 1, FIG. 13 and FIG. 14. FIG. 14 shows a timing chart of the operation state in one period. The chip select signal /CS is at L level, and the operation state takes place.

The operation of the semiconductor device 1 from time $t_0$~time $t_2$ is the same as the operation from time $t_0$~time $t_2$ in the timing chart shown in FIG. 2. In other words, memory cells that are selected by the word line in the n-th row are refreshed in the block (1) 22B, the block (2) 22C and the block (3) 22D.

After the next RF timing signals (0)~(3) become H level (at time $t_5$), the RF request signals (1)~(3) become H level (at time $t_6$) based on the generation of the clock signal ($c_3$).

During the period starting at time $t_1$ and ending at time $t_6$ (this period is called a refresh enable period, and one refreshing is possible in each of the blocks during this period), the block (0) 22A is continuously selected. Therefore, memory cells that are selected by the word line at the n-th row in the block (0) 22A are not refreshed (postponement of refreshing in a certain refresh enable period). Therefore, during this refresh enable period, the RF request signal (0) remains to be at H level, and a count-up signal is not generated.

Accordingly, in the next refresh enable period, memory cells that are also selected by the word line at the same row, namely, at the n-th row in each of the blocks 22 are refreshed. Described in detail, at time $t_6$, the block (1) 22B is selected, such that the external access execution signal (1), and the RF execution signals (0), (2) and (3) become H level. As a result, the memory cells that are selected by the word line at the n-th row are refreshed in the block (0) 22A, the block (2) 22C and the block (3) 22D.

At time $t_7$, the block address changes from the block (1) to the block (2). The RF request signal (1) remains to be at H level, and therefore the RF execution signal (1) changes to H level. By the RF execution signal (1), memory cells that are selected by the word line at the n-th row in the block (1) 22B are refreshed. Then, after a specified time has passed, the RF request signal (1) becomes L level. As a result, the RF execution signal (1) becomes L level, whereby the refreshing is completed (at time $t_8$). By the above operation, refreshing for the memory cells that are selected by the word line at the n-th row in the blocks (0)~(3) is completed.

At time $t_8$, since the entire RF request signals (0)~(3) become L level, the RF counter control 90 outputs a count-up signal at L level (active low) (at time $t_9$).

By the count-up signal, the count value of the RF counter 100 increases by one, and the RF counter 100 outputs corresponding refresh address signals, in other words, address signals corresponding to a row to be refreshed next. By the outputs from the RF counter 100, the row pre-decoders 30A~30D that receive inputs of the refresh execution signals supply signals for refreshing memory cells that are selected by the word line at the (n+1)th row to be refreshed next.

In the manner described above, in accordance with the present embodiment, during a certain refresh enable period, until refreshing for memory cells that are selected by the word line at the n-th row is completed, refreshing for memory cells that are selected by the word line at the (n+1)th row is not performed. Accordingly, refreshing for memory cells in the entire rows can be securely performed.

It is noted that, when the RF counter control 90 is provided, the refresh ability value (the time in which a memory cell can retain data) and the refresh cycle number (the number of word lines of each of the blocks 22: 4096 in the present embodiment) must be considered to determine the refresh capable period (the refresh capable period is determined by the RF timing signals (0)~(3), and the length of the refresh capable period is equal to the cycle of the RF timing signals (0)~(3). In other words, for example, under a condition where the refresh ability value is 200 ms, and the refresh cycle number is about 4000 (because the number of word lines is 4096), the cycle of the RF timing signals (0)~(3) (refresh capable period) assumed to be 50 $\mu$s. (50 $\mu$s×4000=200 ms)

Under this condition, if a refreshing is postponed even once, data cannot be retained. Therefore, for example, the cycle of the RF timing signals (0)~(3) (refresh capable period) is assume to be 45 $\mu$s. (45 $\mu$s×4000=180 ms)

If the cycle of the RF timing signals (0)~(3) (refresh capable period) is set at 45 $\mu$s, data can be retained even when refreshing can be postponed up to 444 times. (200 ms−180 ms)÷45 $\mu$s≅444 times)

It is noted that, as shown in FIG. 15, during the refresh capable period (time $t_1$~time $t_6$), refreshing for the memory cells that are connected to the word line at the n-th row in the block (0) 22A is not yet performed. In the present embodiment, the memory cells that are connected to the word line at the n-th row (the same row) are refreshed in the next refresh capable period (starting at time $t_6$~). However, the present invention is not limited to this embodiment, memory cells that are connected to the word line at the (n+1)th row may be refreshed.

Figure 16:
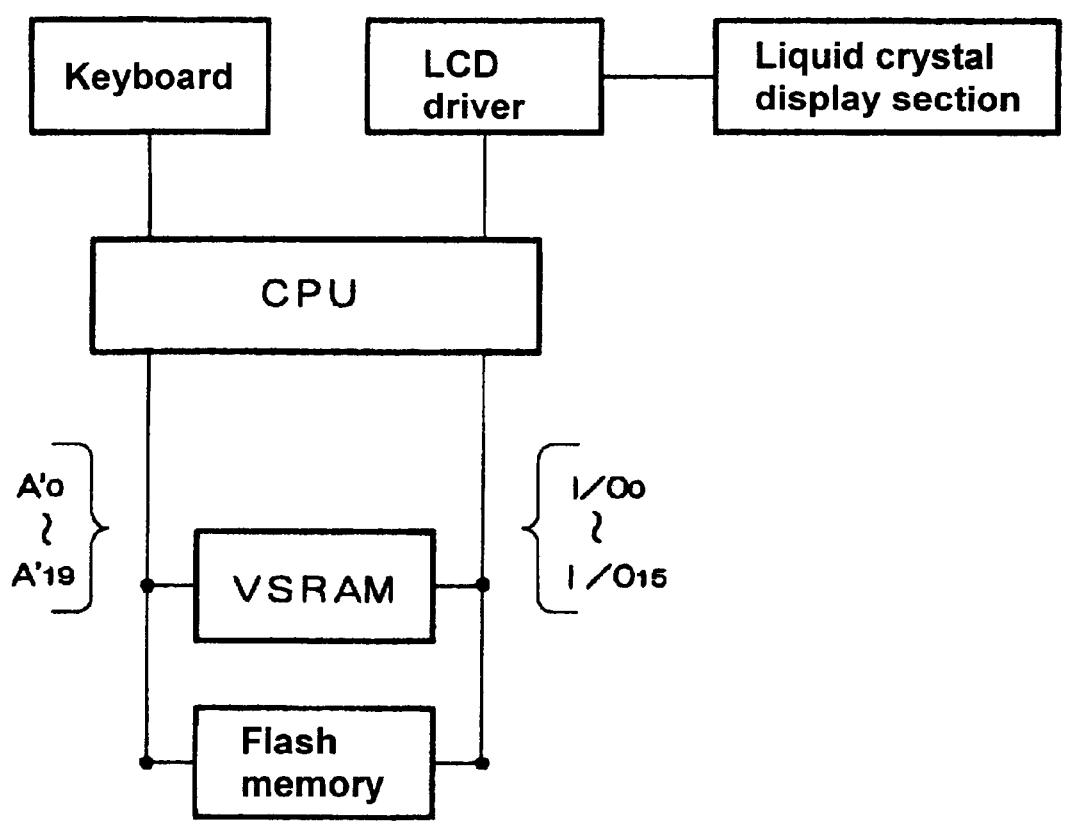
FIG. 16 shows a block diagram in part of a system of a hand-carry telephone equipped with the semiconductor device in accordance with one embodiment of the present invention.

The semiconductor device 1 of the present invention may be applied to an electronic apparatus such as, for example, a hand-carry equipment. FIG. 16 shows a block diagram in part of a system of a hand-carry telephone. A VSRAM corresponds to the semiconductor device 1. A CPU, the VSRAM and a flash memory are mutually connected by a bus line that carries the address signals $A'_0$~$A'_{19}$. Also, the CPU, the VSRAM and the flash memory are mutually connected by a bus line that carries data signals $I/O_0$~$I/O_{15}$. Furthermore, the CPU is connected by a bus line to a keyboard and a LCD driver. The LCD driver is connected to a liquid crystal display section by a bus line. The CPU, the VSRAM and the flash memory form a memory system.

Figure 17:
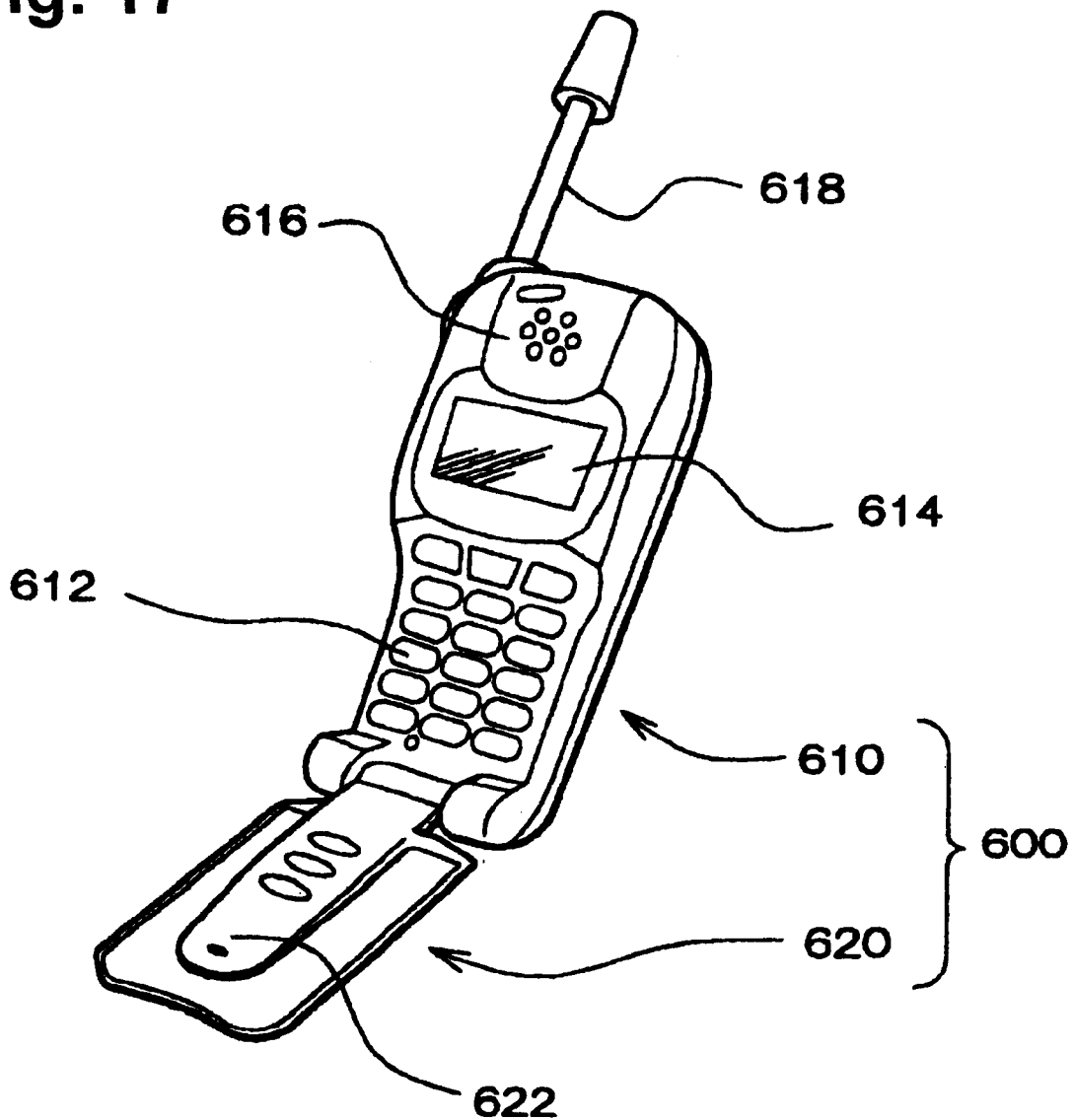
FIG. 17 shows a perspective view of a hand-carry telephone that is equipped with the hand-carry telephone system shown in FIG. 16.

FIG. 17 shows a perspective view of a hand-carry telephone that can incorporate the present invention. For example, FIG. 17 show a hand-carry telephone 600 that is equipped with the hand-carry telephone system shown in FIG. 6. The hand-carry telephone 600 is equipped with a main body section 610 including a keyboard 612, a liquid crystal display section 614, a telephone receiver section 616 and an antenna section 618, and a lid section 620 including a telephone transmission section 622.

While this invention has been described in conjunction with specific embodiments thereof, it is evident that many alternatives, modifications, and variations will be apparent to those skilled in the art. Accordingly, preferred embodiments of the invention as set forth herein are intended to be illustrative not limiting. Various changes may be made without departing from the spirit and scope of the invention.

What is claimed is:

1. A method for refreshing a semiconductor device having a memory cell array that is divided in a plurality of blocks, the method comprising:

a first step of placing the semiconductor device in an externally accessible first state;

a second step of conducting refreshing during the first state for a block among the plurality of blocks other than a block to be externally accessed;

a third step of placing the semiconductor device in an externally inaccessible second state; and a fourth step of conducting refreshing during the second state for at least one of the blocks among the plurality of blocks with a time difference provided with respect to refreshing for the remaining blocks.

2. The method for refreshing a semiconductor device according to claim 1, wherein, in the fourth step, refreshing of each of the plurality of blocks is conducted with a time difference being mutually provided therebetween.

3. The method for refreshing a semiconductor device according to claim 2, wherein the second step and the fourth step further include:

a fifth step of generating a first refresh address signal that is a signal for selecting a first memory cell group to be refreshed that is located in each of the plurality of blocks; and a sixth step of activating a plurality of refresh request signals that are signals for requesting refreshing for each of the plurality of blocks.

4. The method for refreshing a semiconductor device according to claim 3, wherein, in the sixth step and during the second state, the plurality of refresh request signals are activated with time differences being mutually provided therebetween.

5. The method for refreshing a semiconductor device according to claim 4, wherein, in the sixth step and during the second state, the plurality of refresh request signals are activated in a specified order, and, after the sixth step and during the second state, the method further comprises:

a seventh step of generating a second refresh address signal for selecting a second memory cell group to be refreshed that is located in each of the plurality of blocks based on a signal among the plurality of refresh request signals that becomes non-active last.

6. The method for refreshing a semiconductor device according to claim 3, further comprising, after the sixth step and during the first state, an eighth step of generating a second refresh address signal for selecting a second memory cell group to be refreshed that is located in each of the plurality of blocks based on all of the plurality of refresh request signals that are non-active.

7. The method for refreshing a semiconductor device according to claim 1, wherein the semiconductor device includes a VSRAM (Virtually Static RAM).

8. A method for refreshing a semiconductor device, comprising:

refreshing memory cells simultaneously in an externally inaccessible second state of the semiconductor device in a fewer number of times than in an externally accessible first state of the semiconductor device.

9. The method for refreshing a semiconductor device according to claim 8, wherein the semiconductor device is equipped with a memory cell array including the memory cells, and the memory cell array is divided into a plurality of blocks.

10. The method for refreshing a semiconductor device according to claim 9, wherein, in the second state, a refreshing operation for each of the memory cells in each of the plurality of blocks is conducted with a time difference being mutually provided therebetween.

11. A semiconductor device that retains data through refreshing, comprising:
  a memory cell array that is divided into a plurality of blocks; and
  a refresh control circuit that conducts refreshing during an externally accessible first state of the semiconductor device for a block among the plurality of blocks other than a block to be externally accessed, and conducts refreshing during an externally inaccessible second state for each of the blocks among the plurality of blocks with a time difference being mutually provided therebetween.

12. The semiconductor device according to claim 11, wherein the refresh control circuit includes:
  a refresh address signal generation circuit that generates a first refresh address signal that is a signal for selecting a first memory cell group to be refreshed that is located in each of the plurality of blocks;
  a refresh timing signal control that controls a plurality of refresh timing signals respectively corresponding to the plurality of blocks; and
  a plurality of refresh request signal generation circuits provided for the corresponding respective plurality of blocks,
  wherein each of the refresh request signal generation circuits generates a refresh request signal for each of the plurality of blocks based on a corresponding one of the plurality of refresh timing signals.

13. The semiconductor device according to claim 12, wherein the refresh timing signal control activates the plurality of refresh timing signals with a time difference being provided therebetween in the second state.

14. The semiconductor device according to claim 13, wherein the refresh timing signal control includes a detection circuit that detects a start of the second state,
  wherein the refresh timing signal control activates, in the second state, the plurality of refresh timing signals in a specified order based on a detection signal from the detection circuit, and
  the refresh address signal generation circuit generates, in the second state, a second refresh address signal for selecting a second memory cell group to be refreshed that is located in each of the plurality of blocks based on a signal among the plurality of refresh request signals that becomes non-active last.

15. The semiconductor device according to claim 12, wherein the refresh address signal generation circuit generates, in the first state,
  a second refresh address signal for selecting a second memory cell group to be refreshed that is located in each of the plurality of blocks based on all of the plurality of refresh request signals that are non-active.

16. A semiconductor device according to claim 11, wherein the semiconductor device includes a VSRAM (Virtually Static RAM).

17. A memory system comprising the semiconductor device according to claim 11.

18. An electronic apparatus comprising the semiconductor device according to claim 11.

* * * * *